United States Patent
Socha et al.

(10) Patent No.: US 7,292,315 B2
(45) Date of Patent: Nov. 6, 2007

(54) OPTIMIZED POLARIZATION ILLUMINATION

(75) Inventors: Robert Socha, Campbell, CA (US); Donis Flagello, Scottsdale, AZ (US); Steve Hansen, Phoenix, AZ (US)

(73) Assignee: ASML Masktools B.V., Veldhoven (NL)

( * ) Notice: Subject to any disclaimer, the term of this patent is extended or adjusted under 35 U.S.C. 154(b) by 209 days.

(21) Appl. No.: 10/921,878

(22) Filed: Aug. 20, 2004

(65) Prior Publication Data

US 2005/0134822 A1 Jun. 23, 2005

Related U.S. Application Data

(60) Provisional application No. 60/530,662, filed on Dec. 19, 2003.

(51) Int. Cl.
G03B 27/54 (2006.01)

(52) U.S. Cl. ...................................................... 355/67
(58) Field of Classification Search .................. 355/67, 355/71; 716/4; 353/30
See application file for complete search history.

(56) References Cited

U.S. PATENT DOCUMENTS

| | | | |
|---|---|---|---|
| 5,969,441 A | 10/1999 | Loopstra et al. | |
| 6,046,792 A | 4/2000 | Van Der Werf et al. | |
| 6,563,566 B2 | 5/2003 | Rosenbluth et al. | |
| 2001/0033367 A1* | 10/2001 | Karasawa et al. | 353/30 |
| 2005/0044513 A1* | 2/2005 | Robles et al. | 716/4 |

FOREIGN PATENT DOCUMENTS

| | | |
|---|---|---|
| EP | 1 239 331 A2 | 9/2002 |
| EP | 1 530 083 A2 | 5/2005 |
| WO | WO/00/57236 | 9/2000 |
| WO | WO 2004/077154 A2 | 9/2004 |

OTHER PUBLICATIONS

Brayton et al., Robert K., "A New Algorithm for Statistical Circuit Design Based on Quasi-Newton Methods and Function Splitting," IEEE Transactions on Circuits and Systems, vol. CAS-26, No. 9, (Sep. 1979), pp. 784-794.

(Continued)

*Primary Examiner*—Peter B. Kim
(74) *Attorney, Agent, or Firm*—McDermott Will & Emery LLP

(57) ABSTRACT

Disclosed concepts include a method of optimizing polarization of an illumination of a pattern to be formed in a surface of a substrate. Polarized illumination is optimized by determining an illumination intensity for at least one point on an illuminator for at least two polarization states, determining image log slope for the at least one point on the illuminator for the at least two polarization states, determining a maximum image log slope (ILS) where the ILS is near zero for the at least one point on the illuminator, and selecting an optimal polarization state corresponding to the at least two polarization states that minimizes an ILS for the at least one point on the illuminator. This may be repeated for a plurality of points on the illuminator.

16 Claims, 28 Drawing Sheets

OTHER PUBLICATIONS

Flagello et al., Donis G., "Theory of high-NA imaging in homogeneous thin films," J. Opt. Soc. Am. A., vol. 13, No. 1, (Jan. 1996), pp. 53-64.

Baba-Ali et al., Nabila, "Overcoming the Resolution Challenge Using Special Illumination Techniques to Print 50/50 nm Nested Contact Holes at 157 nm Wavelength," Optical Microlithography XV1, Proceedings of SPIE, vol. 5040 (2003), pp. 1352-1362.

Flagello et al., D. G., "Lithographic tolerance based on vector diffraction theory," J. Vac. Sci. Technol. vol. 10, No. 6, (Nov./Dec. 1992), pp. 2997-3003.

Lim et al., Chang-Moon, "Analysis of Horizontal-Vertical Patterning Asymmetry in a Linearly Polarized Deep UV Exposure System," Jpn. J. Appl. Phys., vol. 37, No. 1, (1998), pp. 364-368.

European Search Report Issued in Corresponding European Patent Application No. EP 04257019.2-2222, dated Jun. 27, 2007.

* cited by examiner

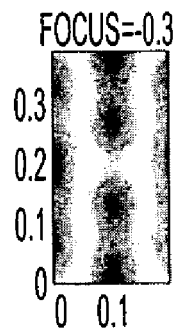 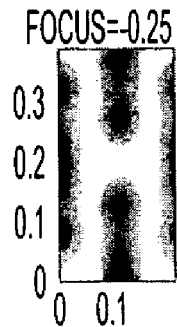 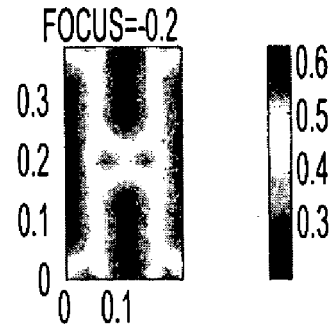
FIG. 14A  FIG. 14B  FIG. 14C
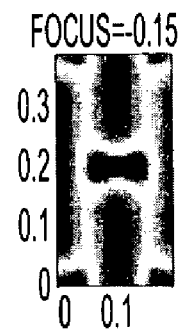 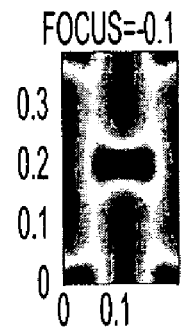 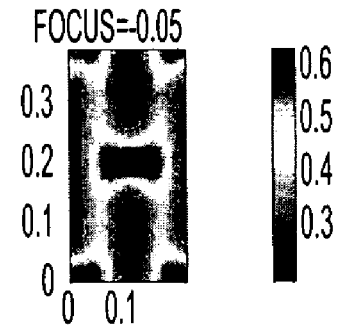
FIG. 14D  FIG. 14E  FIG. 14F
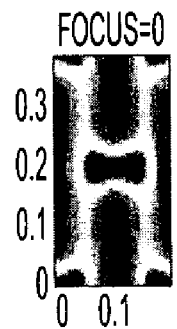 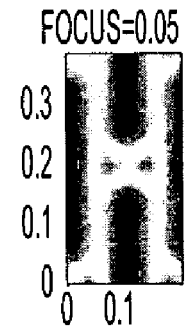 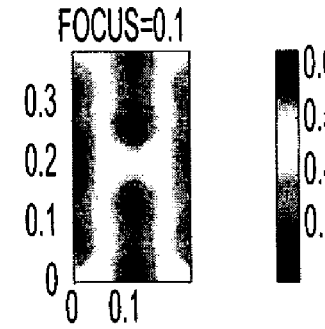
FIG. 14G  FIG. 14H  FIG. 14I

OPTIMIZED POLARIZATION ILLUMINATION

This patent application, and any patent issued therefrom, claim priority from U.S. provisional patent application No. 60/530,662, filed on Dec. 19, 2003, entitled "Lithography Illumination Optimized with Polarization," which is incorporated herein by reference in its entirety.

TECHNICAL FIELD

The technical field relates generally to a method and program product for microlithography for optimizing polarization for an illumination profile of a pattern to be formed in a surface of a substrate.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit.

Of course, one of the goals in integrated circuit fabrication is to faithfully reproduce the original circuit design on the wafer (via the mask). Another goal is to use as much of the semiconductor wafer real estate as possible. Even another goal is to optimize illumination and enhance the contrast of an image on a wafer. By increasing the overall process window (i.e., the ability to consistently print features having a specified CD regardless of whether or not the features are isolated or densely packed relative to adjacent features), one may be able to more easily accomplish each one of the goals.

Methods for optimizing the source illumination and mask patterns so as to improve the overall printing performance have been disclosed in the prior art. One such method is disclosed in U.S. Pat. No. 6,563,566 to Rosenbluth et al., incorporated herein by reference. Specifically, Rosenbluth discloses a lithographic optimization system that alleges to perform an optimization of source illumination and mask patterns to improve the printing of a given mask pattern. The function of merit utilized by Rosenbluth for determining the optimal combination of the source/mask pattern is the aerial image log-slope at a number of pre-selected points along the border of the pattern geometry. The optimization algorithm appears based on the assumption that the printing of a lithographic pattern is solely determined by the set of diffraction orders collected in the imaging pupil, independent of their location in the pupil plane.

While maximizing the aerial image log-slope at selected sampling locations in the pattern enhances the budget/tolerance for exposure variations, commonly referred to as the exposure latitude (EL), it does not help to increase the budget/tolerance for focus variations, commonly referred to as the depth of focus (DOF). Indeed, it is known that patterns that are optimized for EL under in-focus conditions (i.e., at zero DOF) show complementary results compared to patterns that have been optimized for typical process conditions that accommodate for defocus variations. Another problem is the occurrence of uneven line printing; that is, the contrast at a point on the middle of a line is greater than the contrast at a point at an end of a line formed in a resist. It is therefore desirable to optimize illumination to print features with greater precision, so as to enhance EL.

Polarization, though present in most illuminations, is negligible for low numerical aperture (NA) systems because angles of incident at the resist are shallow. Therefore, any negative or positive affects from polarization are minimal. As alluded to above, photolithographic imaging is moving towards smaller and smaller feature sizes, as would be expected. One of many ways to obtain smaller features is to increase the NA. However, angles of incidence at the resist increase, thus enhancing the negative affects caused by polarization and lessening image contrast. It is therefore desirable to overcome these problems, especially in higher NA systems.

SUMMARY

The disclosed concepts include a method of optimizing an illumination for a pattern to be formed in a surface of a substrate. The method includes determining an illumination intensity for at least one point on an illuminator for at least two polarization states. It is further determined an image log slope for the at least one point on the illuminator for the at least two polarization states. Based on these values, a maximum image log slope (ILS) where ILS is at least near zero for the at least one point on the illuminator is determined and an optimal polarization state corresponding to the maximum ILS for the at least one point on the illuminator is selected. Accordingly, polarized illumination may be optimized for the at least one point on the illuminator. This process may be repeated for each of a plurality of points on the illuminator. By combining the optimal polarization state for each of the plurality of points on the illuminator an optimal illumination of the pattern is determined. The optimal polarization state may be a variant, or a combination, of the at least two polarization states, or may correspond to one of the at least two polarization states. Moreover, the at least two polarization states may include at least X and Y polarization states.

The above-described concepts may be implemented by a computer program product, comprising executable code transportable by at least one machine readable medium, wherein execution of the code by at least one programmable computer causes the at least one programmable computer to perform a sequence of steps for optimizing polarized illumination for a pattern to be formed in a surface of a substrate. The computer program product calculates an illumination intensity for at least one point on an illuminator for at least two polarization states, calculates an image log slope for the at least one point on the illuminator for the at least two polarization states, determines a maximum image log slope (ILS) where ILS is at least near zero for the at least one point on the illuminator, and selects an optimal polarization state corresponding to the at least two polarization states that minimizes an ILS for the at least one point on the illuminator. The computer program product may repeat the steps discussed above for each of a plurality of points on the illuminator.

Yet another aspect of the disclosed concepts includes an apparatus for generating a mask design using optimized polarized illumination for increasing process window. The apparatus includes a radiation system for supplying a projection beam of polarized radiation, an illuminator for receiving the projection beam of radiation and projecting an adjusted beam of radiation a portion of a mask, and a projection system for imaging a corresponding irradiated portion of a mask, onto a target portion of a substrate. The illuminator is adjusted at a plurality of points to optimize polarization and intensity at each of the plurality of points. Moreover, a computer system configured to optimize polarization at each of the plurality of points by performing the steps of determining an illumination intensity for at least one point on an illuminator for at least two polarization states, determining image log slope for the at least one point on the illuminator for the at least two polarization states, determining a maximum image log slope (ILS) where ILS is at least near zero for the at least one point on the illuminator, selecting an optimal polarization state corresponding to the at least two polarization states that minimizes an ILS for the at least one point on the illuminator, and repeating these steps for each of the plurality of points on the illuminator.

The foregoing and other features, aspects, and advantages of the present invention will become more apparent from the following detailed description of the present invention when taken in conjunction with the accompanying drawings.

BRIEF DESCRIPTION OF THE DRAWINGS

FIGS. 5A1-5A3 illustrate projection pupils for X polarization applied at the mask, and resulting x, y, and z polarization states at the wafer, respectively.

FIGS. 5B1-5B3 illustrate projection pupils for Y polarization applied at the mast and resulting x, y, and z polarization states a the wafer, respectively.

FIGS. 9A1 and 9A2 illustrate illumination pupil NILS response plots of fragmentation point 1 for X polarization for two intensity ranges.

FIGS. 9B1 and 9B2 illustrate illumination pupil NILS response plots of fragmentation point 1 for Y polarization for two intensity ranges.

FIGS. 10A1 and 10A2 illustrate illumination pupil NILS response plots of fragmentation point 2 for X polarization for two intensity ranges, respectively.

FIGS. 10B1 and 10B2 illustrate illumination pupil NILS response plots of fragmentation point 2 for Y polarization for two intensity ranges, respectively.

FIGS. 11A1 and 11A2 illustrate illumination pupil NILS response plots of fragmentation point 13 for X polarization for two intensity ranges, respectively.

FIGS. 11B1 and 11B2 illustrate illumination pupil NILS response plots of fragmentation point 3 for Y polarization for two intensity ranges, respectively.

FIGS. 14(A)-(I) show a simulation of the print of the brick wall pattern of FIG. 4A with the wafer topography of FIG. 4B for optimized TE polarized illumination from a focus of −0.3 to a focus of 0.1 at increments of 0.05, respectively.

FIGS. 17A1-17A3 illustrate projection pupils illustrate projection pupils for X polarization applied at the mask, and resulting x, y, and z polarization states at the wafer, respectively.

FIGS. 17B1-17B3 illustrate projection pupils for Y polarization applied at the mast and resulting x, y, and z polarization states a the wafer, respectively.

FIGS. 21A1 and 21A2 illustrate illumination pupil NILS response plots of fragmentation point 1 for X polarization for two intensity ranges, respectively.

FIGS. 21B1 and 21B2 illustrate illumination pupil NILS response plots of fragmentation point 1 for Y polarization for two intensity ranges, respectively.

FIGS. 22A1 and 22A2 illustrate illumination pupil NILS response plots of fragmentation point 2 for X polarization for two intensity ranges, respectively.

FIGS. 22B1 and 22B2 illustrate illumination pupil NILS response plots of fragmentation point 2 for Y polarization for two intensity ranges, respectively.

FIGS. 23A1 and 23A2 illustrate illumination pupil NILS response plots of fragmentation point 13 for X polarization for two intensity ranges, respectively.

FIGS. 23B1 and 23B2 illustrate illumination pupil NILS response plots of fragmentation point 3 for Y polarization for two intensity ranges, respectively.

DESCRIPTION

In microlithography, resolution of an image applied to a photoresist layer improves as the numerical aperture (NA) of the optical system increases. With a higher resolution, higher process windows are possible. However, such systems are limited by diffraction through air. It has been found that higher NA's are achievable with application of water between the lens of the optical system and the photoresist layer on the wafer, often referred to immersion lithography. However, by increasing the NA of the optical system, negative effects of the electric field on the photoresist also increase. Thus, it is desirable to reduce negative effects of the electric field while maintaining a high NA. One way to reduce these negative electric field effects is to polarize the illumination. It has been found that polarized illumination enhances exposure latitude and process windows in dry systems as well.

There are two types of polarization, each component being orthogonal to each other, often referred to in optics as "S polarization" and "P polarization." With S polarization, the electric field is always perpendicular to the direction of propagation of light. Because the light is always perpendicular to the direction of propagation, when two beams of light that have S polarization interfere, they will have very good contrast, as is well known to those of ordinary skill in the art. As for P polarization, the electric field is in the plane of propagation of light, and will cause a destructive interference which in some cases is preferred. As a result, in higher NA systems, it is desirable to optimize S&P polarization as much as possible.

Often polarization may be referred to as X & Y polarization. Notwithstanding, the relationship between S&P and X&Y polarization is well known. P polarization corresponds to a direction that is normal to the mask feature (X direction for a mask feature oriented in the Y direction). S polarization corresponds to a direction that is parallel to the mask feature (Y direction for a mask feature oriented in the Y direction). Mathematically, P polarization is related to X and Y polarization by $\hat{p}=\hat{x} \cos \phi+\hat{y} \sin \phi$, and S polarization is related to X and Y polarization by $\hat{s}=-\hat{x} \sin \phi+\hat{y} \cos \phi$, where $\phi=\tan^{-1}(\beta/\alpha)$ and coordinates $\alpha$ and $\beta$ may be defined.

Figures 1, 1C:
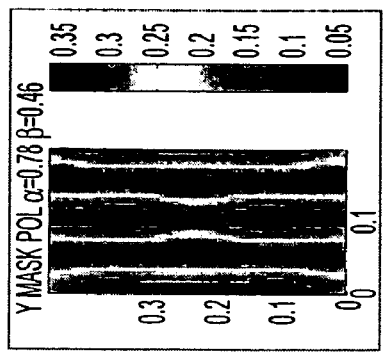
FIGS. 1C1-C4 illustrate aerial images corresponding to certain points on the illuminator of FIG. 1b.
Figures 1, 1C, 2:
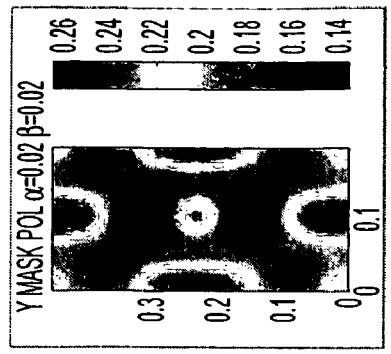
FIG. 2 illustrates an exemplary flow diagram for optimizing polarized illumination in accordance with the present invention.
Figures 1, 1C, 2, 3:
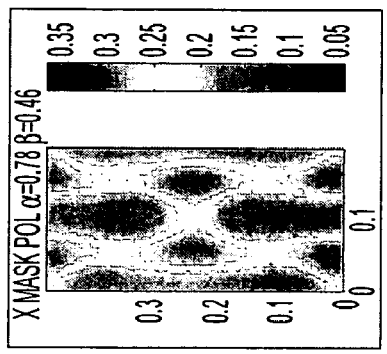
FIG. 3 illustrates an exemplary computer system configured to optimize polarized illumination in accordance with the present invention.
Figures 1, 1C, 2, 3, 4:
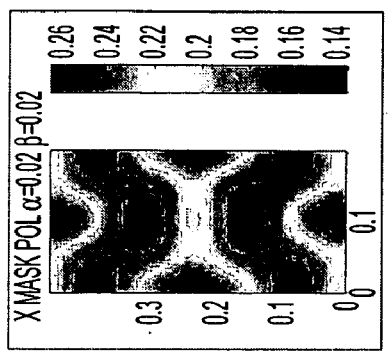
Figure 1B:
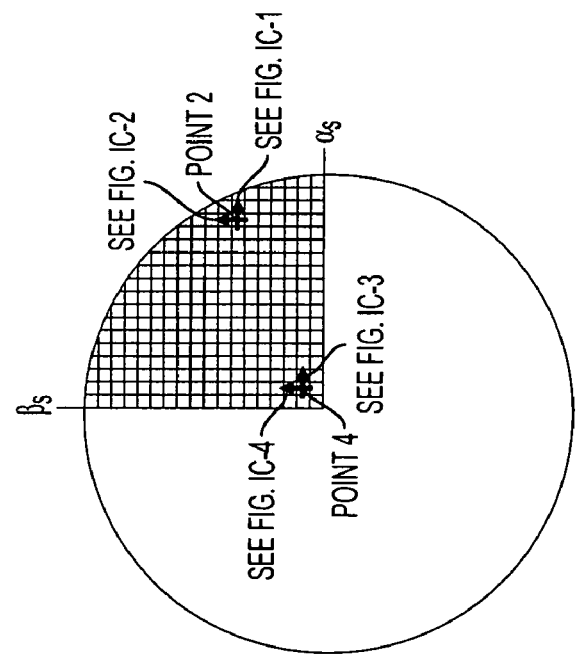
FIGS. 1A and B illustrate an exemplary brick wall pattern and illuminator used to image the pattern, respectively.
Figure 1A:
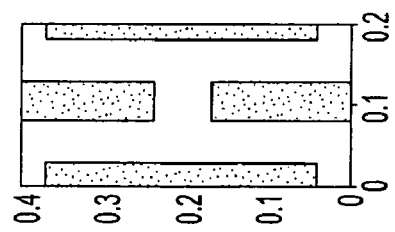
Figure 2:
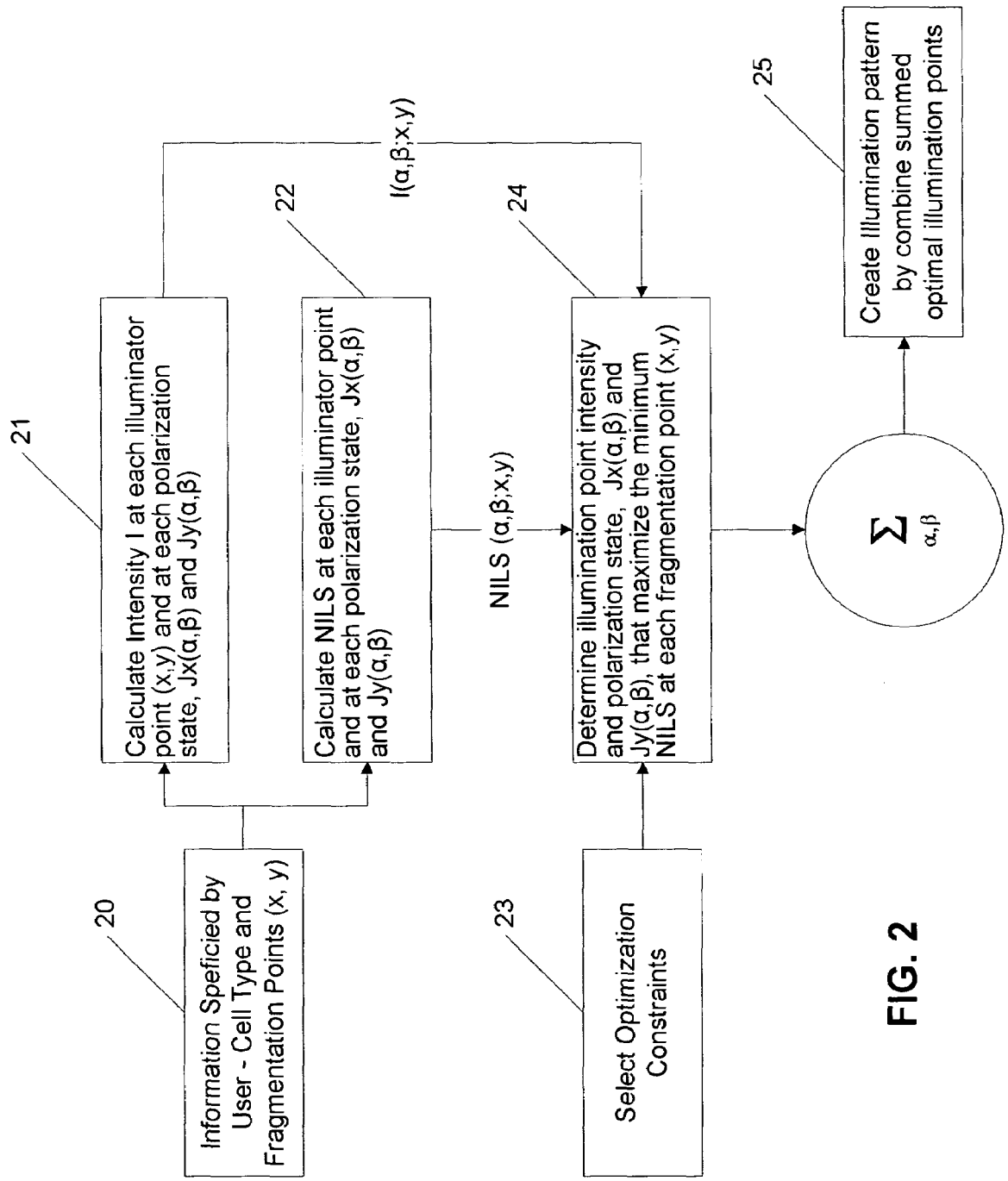
Figure 3:
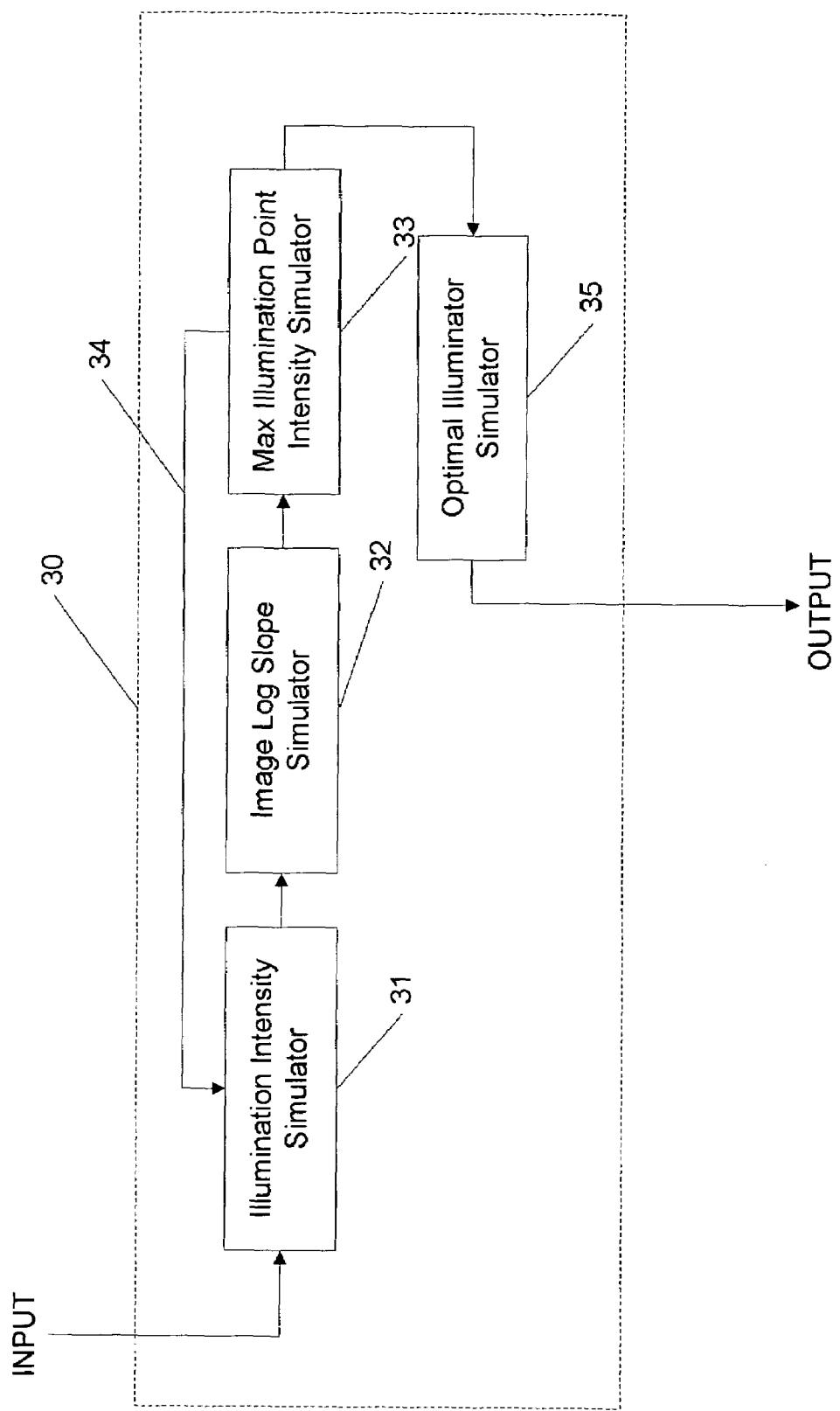

FIG. 1A illustrates an exemplary brick wall isolation microlithographic mask pattern, and FIG. 1B illustrates an illuminator for imaging that pattern. Points on the illuminator of FIG. 1B may be represented by a Cartesian coordinate grid having axes $\alpha_s$ and $\beta_s$, and each point on the illuminator may be analyzed for determining an aerial image, or illumination intensity, on the reticle. FIGS. 1C-1 and C-2 show the aerial images of X and Y polarization components, respectively, at point 2 on the illuminator of FIG. 1B. FIGS. 1C-3 and 1C-4 show the aerial images of X and Y polarization components, respectively, at point 4 on the illuminator of FIG. 1B.

Specifically FIGS. 1C-1 and C-2 illustrate aerial images of X polarization at the mask and Y polarization at the mask, respectively, for point 2 ($\alpha_s$, 0.78; $\beta_s$, 0.46) on the illuminator. As seen in these aerial images, Y polarization (FIG. 1C-2) has a better contrast than the X polarization (FIG. 1C-1). Therefore, it would be desirable to design an illuminator that takes into account both X & Y polarization to maximize Y polarization and limit X polarization (FIG. 1C-1.

Also, referring to the aerial images of the X polarization at the mask and Y polarization at the mask (FIGS. 1C-3 and 1C-4, respectively), for point 4 ($\alpha_s$, 0.02; $\beta_s$, 0.02), X polarization (FIG. 1C-3) has a better contrast than the Y polarization (FIG. 1C-4). Therefore, at this point on the illuminator, it would be desirable to maximize X polarization.

As a result, by balancing X polarization and Y polarization among each cell or point of an illuminator, the overall illumination is optimized resulting in better contrast or resolution over existing systems.

Each point on the illuminator may be analyzed for determining a polarization state that produces an aerial image with optimal contrast. However, manually analyzing aerial images for a plurality of points of an illuminator in the foregoing manner is rather time-consuming. The inventors have devised further novel techniques for optimizing polarized illumination.

Figure 4A:
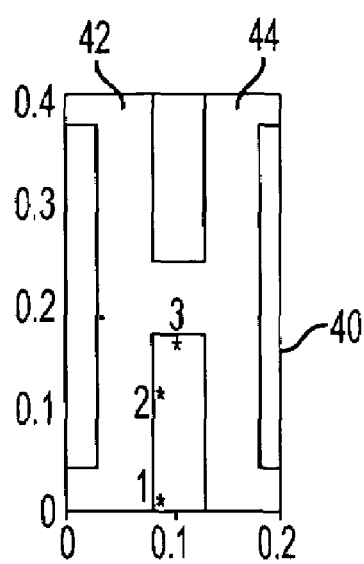
FIG. 4A illustrates an exemplary half-pitch brick wall isolation pattern microlithographic mask feature with three fragmentation reference points.
Figure 16A:
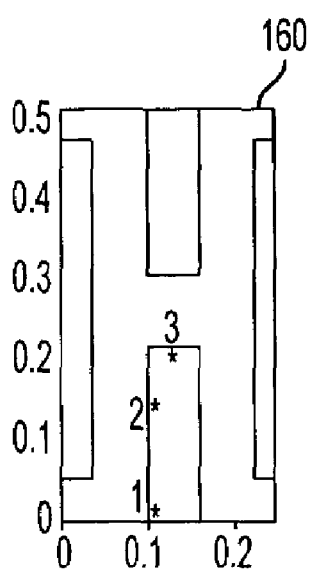
FIG. 16A illustrates a half-pitch brick wall isolation pattern microlithographic mask feature with three fragmentation reference points.

FIG. 2 illustrates a flow diagram of the process employed to optimize illumination intensity in accordance with the present disclosure. First, in step 20, a cell type (e.g. region of the desired mask pattern) and fragmentation points (e.g., points included in the cell) are selected. As shown in FIGS. 4A and 16A, an exemplary brick wall mask pattern is chosen for the cell, and three fragmentation points 1, 2, and 3 are selected. These points correspond to an end of a line (fragmentation point 1), middle of a line (fragmentation point 2), and a point bridging two lines (fragmentation point 3), respectively. Any number of fragmentation points may be chosen for a given cell, and often depends on the complexity of the pattern. For explanation purposes, three fragmentation points were selected and represent global feature types. Of course, the more fragmentation points utilized will increase accuracy of the optimization techniques described herein.

Referring back to FIG. 2, in Step 21, intensity at each point (x,y) in the wafer plane (image plane) is determined from each point ($\alpha_s$, $\beta_s$) in the illuminator plane for each polarization state $J_x(\alpha_s, \beta_s)$ and $J_y(\alpha_s, \beta_s)$, using the theory of Abbe imaging. An expression in terms of $I(\alpha_s,\beta_s; x, y)$ may be generated which describes the intensity transfer function at a wafer point (x,y) resulting from the intensity at a illumination point ($\alpha_s$, $\beta_s$). Equations for determining intensity in the given manner are known to those of ordinary skill in the art. The intensity transfer function, $I(\alpha_s,\beta_s; x, y)$, is shown in Equation 3.0 (discussed later).

In Step 22, the Normalized Image Log Slope (NILS) or Image Log Slope (ILS) is determined for each polarization state $J_x(\alpha_s,\beta_s)$ and $J_y(\alpha_s,\beta_s)$, and at each fragmentation point (x, y). Following the determination of the intensity, an Image Log Slope (ILS) may be determined according to Equation 1.0.

Equation 1.0 →
$$ILS(x, y) = \hat{n} \cdot \nabla \ln[I(x, y)]$$
$$= \hat{n} \cdot \hat{n} \cdot \left[\hat{x}\frac{\partial I(x, y)}{\partial x} + \hat{y}\frac{\partial I(x, y)}{\partial y}\right] \frac{1}{I(x, y)}$$

As a practical matter, it is best to normalize the ILS, as provided by Equation 2.0.

$$NILS(x,y) = w\hat{n} \cdot \nabla \ln[I(x,y)] \quad \text{Equation 2.0}$$

where w is the normalization factor with units of Length such as CD or $\lambda$/NA.

As a result, $I(\alpha_s,\beta_s; x, y)$ and $NILS(\alpha_s,\beta_s; x, y)$ may be determined. Equation 3.0 corresponds to $I(x,y)$ applied to Equations 1.0 and 2.0.

$$I(x,y) = \iint d\alpha_s d\beta_s \{J_x(\alpha_s,\beta_s)[I_{xx}(\alpha_s,\beta_s;x,y) + I_{yx}(\alpha_s,\beta_s;x,y) + I_{zx}(\alpha_s,\beta_s;x,y)] + J_y(\alpha_s,\beta_s)[I_{xy}(\alpha_s,\beta_s;x,y) + I_{yy}(\alpha_s,\beta_s;x,y) + I_{zy}(\alpha_s,\beta_s;x,y)]\} \quad \text{Equation 3.0}$$

where:

Ixx represents the intensity in the x direction at the image plane resulting from a field with x direction polarization at the object plane, Iyx represents the intensity in the y direction at the image plane resulting from a field with x direction polarization at the object plane, Izx represents the intensity in the z direction at the image plane resulting from a field with x direction polarization at the object plane, Ixy represents the intensity in the x direction at the image plane resulting from a field with y direction polarization at the object plane, Iyy represents the intensity in the y direction at the image plane resulting from a field with y direction polarization at the object plane, and Izy represents the intensity in the z direction at the image plane resulting from a field with y direction polarization at the object plane.

In order to save space in the following equations (Equations 4.0 and 4.1) for expanding Equation 1.0, (x,y) has omitted for all the intensities, I, and all the electric field components, E, and ($\alpha_s,\beta_s$) has been omitted for all the illumination intensities Jx and Jy.

Equation 4.0 →
$$\frac{\partial I}{\partial x} = \iint d\alpha_s d\beta_s \left[ J_x\left(\frac{\partial I_{xx}}{\partial x} + \frac{\partial I_{yx}}{\partial x} + \frac{\partial I_{zx}}{\partial x}\right) + J_y\left(\frac{\partial I_{xy}}{\partial x} + \frac{\partial I_{yy}}{\partial x} + \frac{\partial I_{zy}}{\partial x}\right) \right]$$

Equation 4.1 →
$$\frac{\partial I}{\partial y} = \iint d\alpha_s d\beta_s \left[ J_x\left(\frac{\partial I_{xx}}{\partial y} + \frac{\partial I_{yx}}{\partial y} + \frac{\partial I_{zx}}{\partial y}\right) + J_y\left(\frac{\partial I_{xy}}{\partial y} + \frac{\partial I_{yy}}{\partial y} + \frac{\partial I_{zy}}{\partial y}\right) \right]$$

$I_{xx} = E_{xx}E_{xx}^*$ or more generally for intensity and electric field components, ij represents the polarization state at object plane, i, due to polarization state at image plane, j, and is given by the generic notation of Equation 5.0.

$$I_{ij} = E_{ij}E_{ij}^* \quad \text{Equation 5.0}$$

Equations 4.0 and 4.1 may be expanded further in the following manner.

$$\frac{\partial I_{xx}}{\partial x} = \frac{\partial E_{xx}}{\partial x}E_{xx}^* + E_{xx}\frac{\partial E_{xx}^*}{\partial x} \qquad \frac{\partial I_{ij}}{\partial x} = \frac{\partial E_{ij}}{\partial x}E_{ij}^* + E_{ij}\frac{\partial E_{ij}^*}{\partial x}$$

$$\frac{\partial I_{xx}}{\partial y} = \frac{\partial E_{xx}}{\partial y}E_{xx}^* + E_{xx}\frac{\partial E_{xx}^*}{\partial y} \qquad \frac{\partial I_{ij}}{\partial y} = \frac{\partial E_{ij}}{\partial y}E_{ij}^* + E_{ij}\frac{\partial E_{ij}^*}{\partial y}$$

$$\frac{\partial E_{xx}}{\partial x} = j2\pi\left(\frac{m}{P_x} + \frac{NA\alpha_s}{\lambda}\right)E_{xx} \qquad \frac{\partial E_{ij}}{\partial x} = j2\pi\left(\frac{m}{P_x} + \frac{NA\alpha_s}{\lambda}\right)E_{ij}$$

$$\frac{\partial E_{xx}^*}{\partial x} = -j2\pi\left(\frac{m}{P_x} + \frac{NA\alpha_s}{\lambda}\right)E_{xx}^* \qquad \frac{\partial E_{ij}^*}{\partial x} = -j2\pi\left(\frac{m}{P_x} + \frac{NA\alpha_s}{\lambda}\right)E_{ij}^*$$

$$\frac{\partial E_{xx}}{\partial y} = j2\pi\left(\frac{n}{P_y} + \frac{NA\beta_s}{\lambda}\right)E_{xx} \qquad \frac{\partial E_{ij}}{\partial y} = j2\pi\left(\frac{n}{P_y} + \frac{NA\beta_s}{\lambda}\right)E_{ij}$$

$$\frac{\partial E_{xx}^*}{\partial y} = -j2\pi\left(\frac{n}{P_y} + \frac{NA\beta_s}{\lambda}\right)E_{xx}^* \qquad \frac{\partial E_{ij}^*}{\partial y} = -j2\pi\left(\frac{n}{P_y} + \frac{NA\beta_s}{\lambda}\right)E_{ij}^*$$

$$E_{xx} = \exp\left[jx2\pi\left(\frac{m}{P_x} + \frac{NA\alpha_s}{\lambda}\right)\right]\exp\left[jy2\pi\left(\frac{n}{P_y} + \frac{NA\beta_s}{\lambda}\right)\right]$$
$$F(m,n)P_{xx}\left(\alpha_s + \frac{m\lambda}{P_x NA}, \beta_s + \frac{n\lambda}{P_y NA}\right)$$

$$E_{ij} = \exp\left[jx2\pi\left(\frac{m}{P_x} + \frac{NA\alpha_s}{\lambda}\right)\right]\exp\left[jy2\pi\left(\frac{n}{P_y} + \frac{NA\beta_s}{\lambda}\right)\right]$$
$$F(m,n)P_{ij}\left(\alpha_s + \frac{m\lambda}{P_x NA}, \beta_s + \frac{n\lambda}{P_y NA}\right)$$

$$E_{ij}^* = \exp\left[-jx2\pi\left(\frac{m}{P_x} + \frac{NA\alpha_s}{\lambda}\right)\right]\exp\left[-jy2\pi\left(\frac{n}{P_y} + \frac{NA\beta_s}{\lambda}\right)\right]$$
$$F^*(m,n)P_{ij}^*\left(\alpha_s + \frac{m\lambda}{P_x NA}, \beta_s + \frac{n\lambda}{P_y NA}\right)$$

where Pij is the image transfer function from the object plane (reticle plane) to the image plane (wafer plane). In Pij, j is the state of polarization at the object and i is the state of polarization at the image. In a reduction system, only x and y polarization are used at the object plane, j, and x, y, and z polarization are used at the image plane, i. The transfer function, Pij, is given in D. G. Flagello et. al. "Theory of high-NA imaging in homogeneous thin films," J. Opt. Soc. Am. A Vol. 13, No. 1, January 1996, page 53, and is reproduced below in Equation 6.0.

$$\text{Equation 6.0} \rightarrow \begin{bmatrix} P_{xx} & P_{xy} \\ P_{yx} & P_{yy} \\ P_{zx} & P_{zy} \end{bmatrix} = \begin{bmatrix} F_s & F_p & 0 & 0 & 0 \\ 0 & 0 & F_s & F_p & 0 \\ 0 & 0 & 0 & 0 & F_{zp} \end{bmatrix} \begin{bmatrix} P_{xxs} & P_{yxs} \\ P_{xxp} & P_{yxp} \\ P_{xys} & P_{yys} \\ P_{xyp} & P_{yyp} \\ P_{xzp} & P_{yzp} \end{bmatrix}$$

In Step 23, optimization constraints are selected, and typically include specifications (or limitations) of the illumination system, such as "Zeiss Specs." These specifications typically include manufacturing constraints, such as a minimum pupil fill of, for example, 10%, and minimum ring width of, for example, 0.2. It is noted that other optimization constraints may be chosen and are well within the level of one of ordinary skill in the art. Based on the calculations discussed above and the optimization constraints set, in Step 24 illumination point intensity and polarization states that maximize the minimum NILS are selected at each fragmentation point (x, y). As set forth below by Equation 7.0, by integrating equation 68, the illumination point intensity and polarization states that maximize the minimum NILS are determined.

Equation 7.0 →

$$\max_{\{J_x(\alpha_s,\beta_s), J_y(\alpha_s,\beta_s)\}} [\min\{ILS_1(x,y), ILS_2(x,y), \ldots, ILS_n(x,y)\}]$$

This minimax problem is solved by using Sequential Quadratic Programming from the reference, Brayton, R. K., et. al., "A New Algorithm for Statistical Circuit Design Based on Quasi-Newton Methods and Function Splitting," IEEE Trans. Circuits and Systems, Vol. CAS-26, pp. 784-794, September 1979.

NILS has a direct correlation to exposure latitude or EL. The maximum minimum NILS (i.e., the maximum point where slope is 0 or near 0) at each fragment point represents the maximum Exposure Latitude (EL). In other words, NILS is the measure of the image contrast. In an ideal environment, a NILS plot would accurately represent a cross-section of a feature, having vertical edges (slopes of infinity) and horizontal surfaces (slopes of 0). Maximizing the minimum NILS is closest to an ideal feature. Therefore, at each point on the illuminator where NILS is maximized, the aerial image would have the best contrast.

In Step 25, $J_x(\alpha_s, \beta_s)$ and $J_y(\alpha_s, \beta_s)$ are then summed to determine the optimal illumination to maximize the minimum NILS at each fragmentation point (x, y) at the desired intensity to create an illumination pattern.

As described above, each point on the illuminator is analyzed. However, not all points of an illuminator need to be analyzed, and depends on symmetry of a given pattern. If a given pattern is symmetric about two axes, only a quarter of the illuminator needs to be analyzed. This is seen in the brick wall pattern examples discussed herein. Conversely, if a pattern is symmetric about one axis, only half of the illuminator needs to be analyzed. Moreover, with most, and if not all, patterns, the illuminator will have some kind of symmetry even if a given pattern is not symmetric about X and/or Y axes. In most cases, only half of an illuminator needs to be analyzed.

Following these steps, an actual illuminator may be created by optimizing each pixel corresponding to each point analyzed above. However, predetermined criteria may be followed for determining which pixel or group of pixels to optimize in accordance with the foregoing techniques. Of course, one of ordinary skill in the art will be able to set predetermined criteria for determining which pixels to optimize. Predetermined criteria would likely depend on the type of illuminator, scanner, etc., and given pattern.

FIG. 3 illustrates a computer system 30 adapted for optimizing illumination as described above. The computer system includes an illumination simulator 31 for determining intensity at each point on an illuminator for each polarization state. Based on the illumination and polarization states, Image Log Slope Simulator 32 generates an ILS or NILS. Max Illumination Point Intensity Simulator 33 maximizes minimum ILS or NILS based on the output of ILS Simulator 32. A feedback path 34 is provided for prompting calculations for each point on the illuminator.

Finally, Optimal Illuminator Simulator 35 creates an optimum illuminator based on calculation representing each point of the illuminator.

The examples below optimize polarization illumination for both an immersed system and a dry system, using the techniques discussed above.

EXAMPLE 1

Immersed System

Referring to FIG. 4A, a brick wall isolation pattern 40 for a 0.4 nm by 0.2 nm section of a microlithographic mask is illustrated. Illustrated further are three fragmentation points, denoted by numerals 1, 2 and 3. As mentioned above, fragmentation point 1 corresponds to the end of the line feature 42 of the brick wall pattern 40; fragmentation point 2 corresponds to a mid-point of the line feature 42; and fragmentation point 3 corresponds to a connection of lines 42 and 44.

Figure 4B:
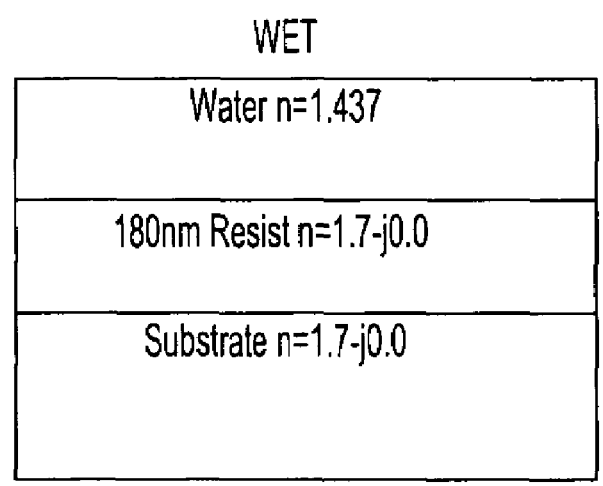
FIG. 4B illustrates wafer topography for an immersion system.

FIG. 4B illustrates wafer topography for an immersion system to which the brick wall pattern 40 of FIG. 4A was applied. An illumination system (described below) was used having a wavelength, λ, of 193 nm and a numerical aperture, NA, of 1.2.

Figures 1, 5A:
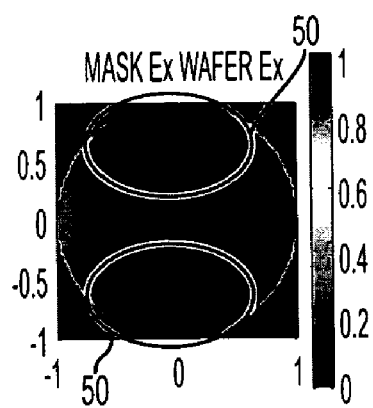
Figures 2, 5A:
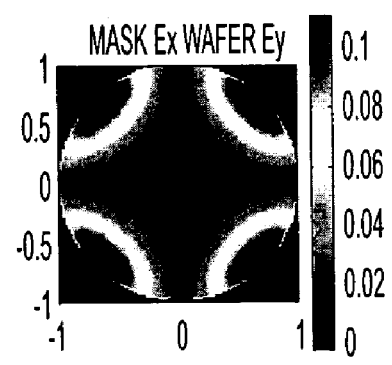
Figures 3, 5A:
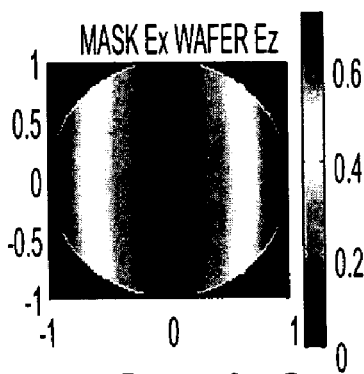

FIGS. 5A-1 through A-3 and 5B-1 through B-3 illustrate a simulation representing the transfer of the projection pupil to the substrate. For example, an illumination at the mask having X polarization may influence other polarization states at the wafer. This can be represented by the following equation.

The transfer function, Pij, is given in D. G. Flagello et. al. "Theory of high-NA imaging in homogeneous thin films," J. Opt. Soc. Am. A Vol. 13, No. 1, January 1996, page 53. Pij is shown below.

$$\begin{bmatrix} P_{xx} & P_{xy} \\ P_{yx} & P_{yy} \\ P_{zx} & P_{zy} \end{bmatrix} = \begin{bmatrix} F_s & F_p & 0 & 0 & 0 \\ 0 & 0 & F_s & F_p & 0 \\ 0 & 0 & 0 & 0 & F_{zp} \end{bmatrix} \begin{bmatrix} P_{xxs} & P_{yxs} \\ P_{xxp} & P_{yxp} \\ P_{xys} & P_{yys} \\ P_{xyp} & P_{yyp} \\ P_{xzp} & P_{yzp} \end{bmatrix}$$

Figures 1, 5B:
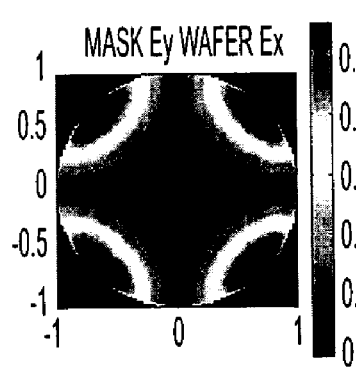
Figures 2, 5B:
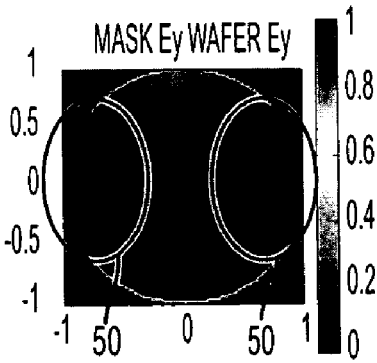
Figures 3, 5B:
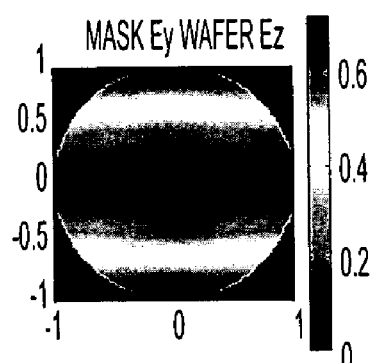

FIGS. 5A-1-5A-3 illustrate simulations for X polarization at the mask (Mask Ex), and polarization states at the wafer (Wafer Ex, Wafer Ey, and Wafer Ez, respectively). FIGS. 5B-1-5B-1 illustrate simulations for Y polarization at the mask (Mask Ey), and polarization states at the wafer (Wafer Ex, Wafer Ey, and Wafer Ez, respectively). As would be expected, polarization Mask Ex and Wafer Ex (FIG. 5A-1) and polarization Mask Ey and Wafer Ey (FIG. 5B-2) illustrate states in which optimal contrast can be accomplished. That is, if an illuminator could be designed to force all light through pupil segments 50, optimal contrast would be obtained. In contrast to FIGS. 5A-2, 5A-3, 5B-1, & 5B-3, polarization states and intensity at the wafer are sporadic, and would cause reduced contrast.

Figure 6:
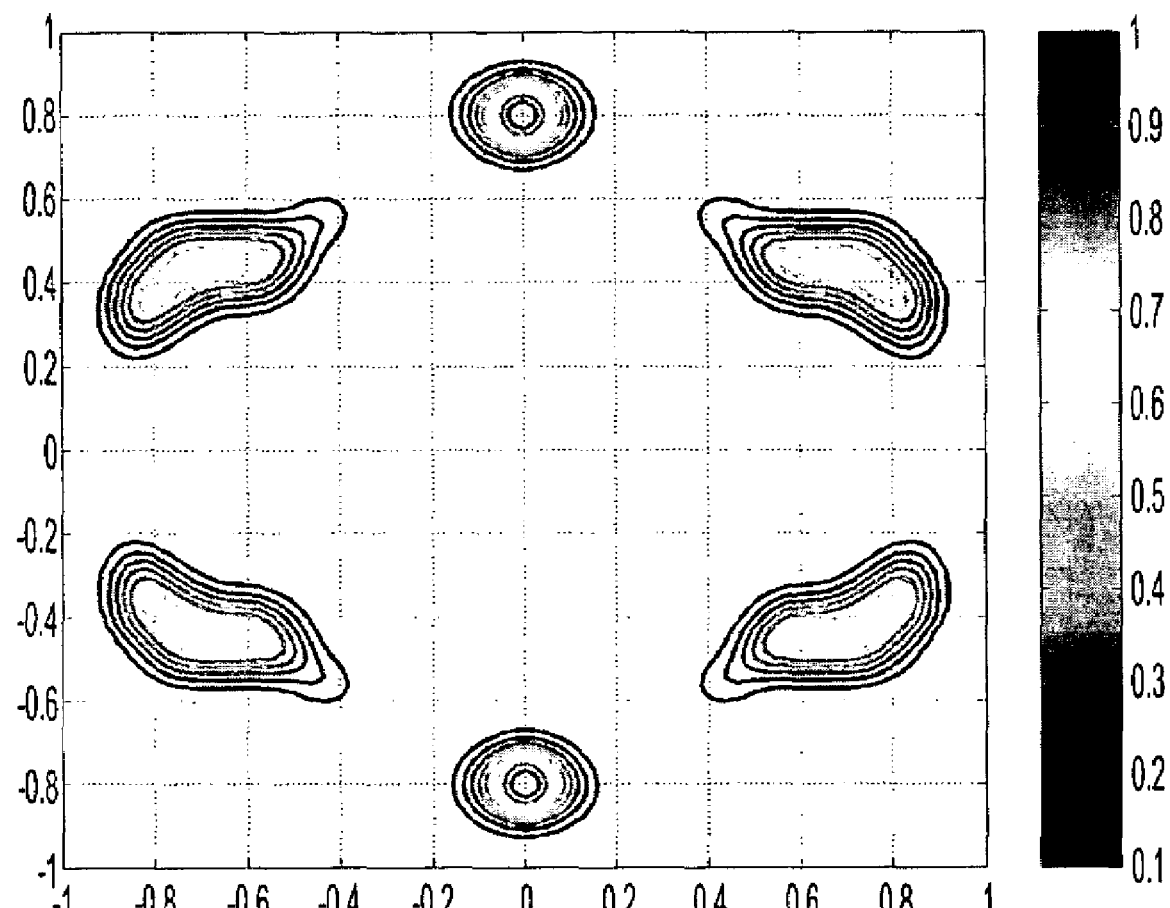
FIG. 6 illustrates an optimized unpolarized illumination for the brick wall pattern of FIG. 4A with the wafer topography of FIG. 4B.
Figure 7:
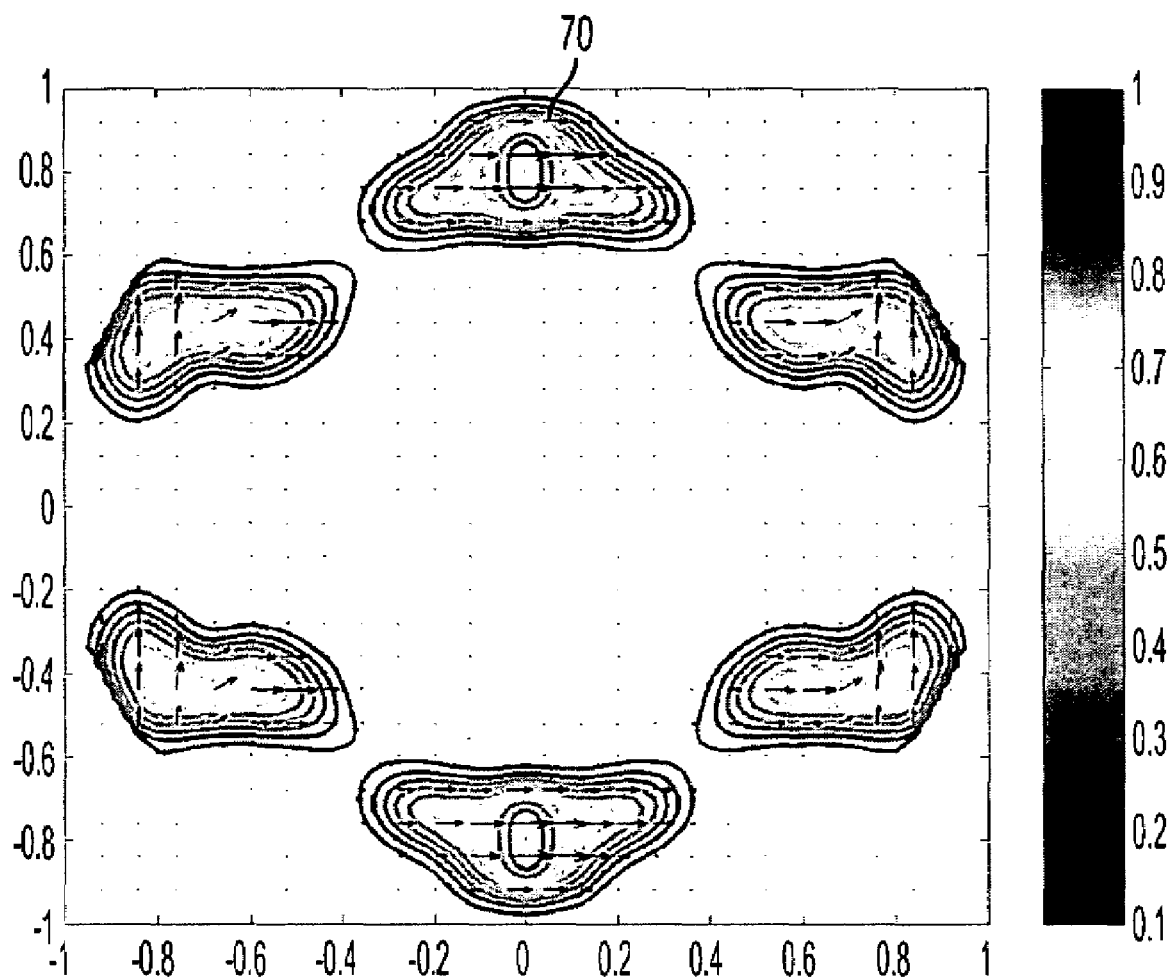
FIG. 7 illustrates an optimized polarized illumination for the brick wall pattern of FIG. 4A with the wafer topography of FIG. 4B.
Figure 8:
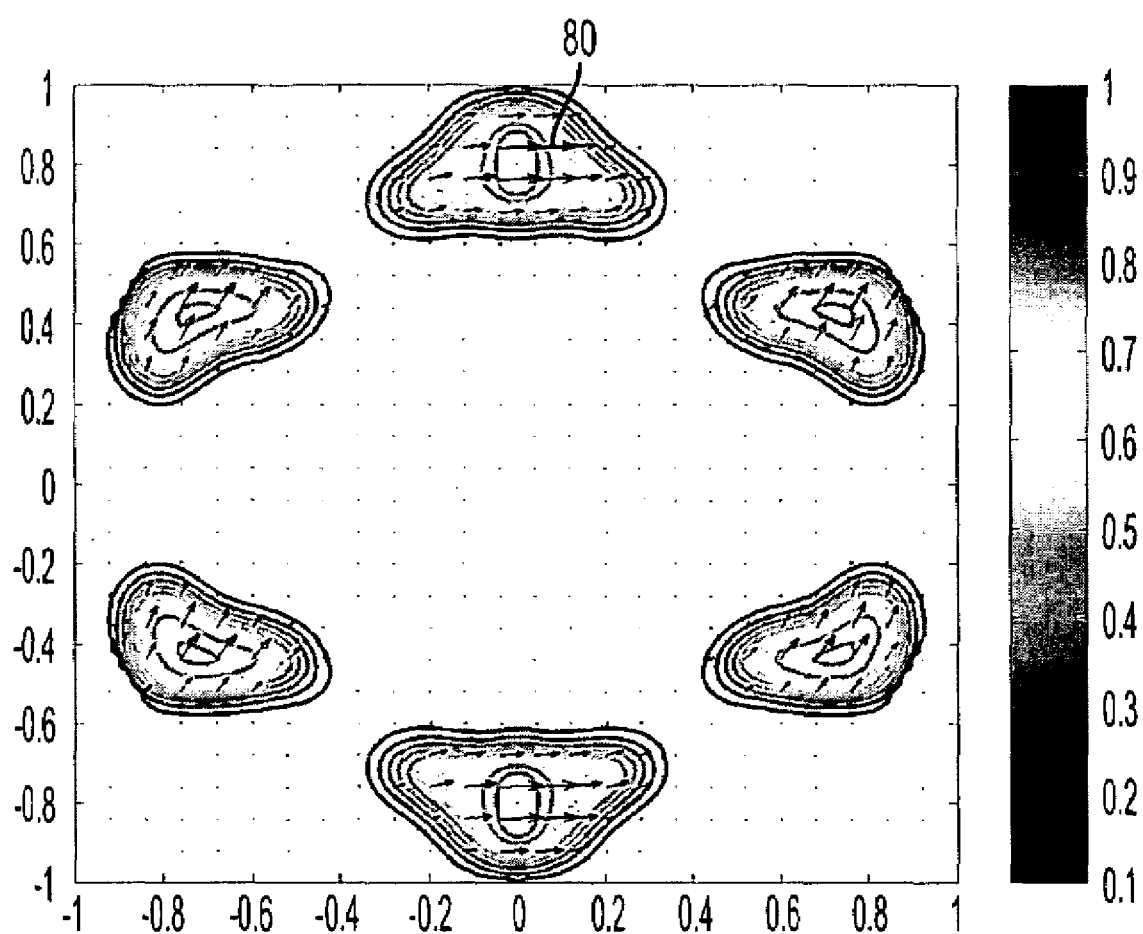
FIG. 8 illustrates an optimized TE azimuthal polarized illumination for the brick wall pattern of FIG. 4A with the wafer topography of FIG. 4B.
Figures 1, 9A:
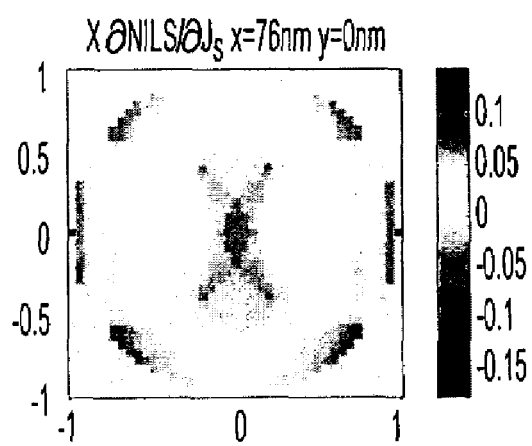
Figures 2, 9A:
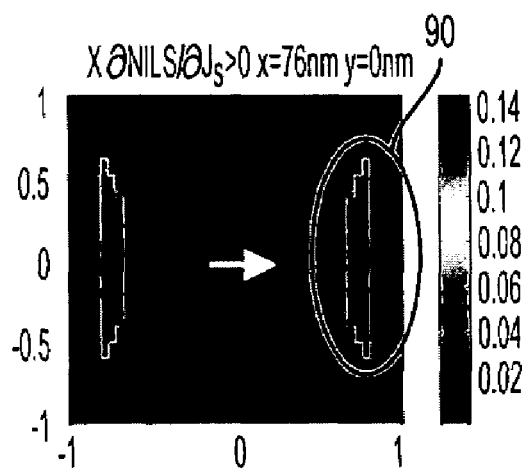
Figures 1, 9B:
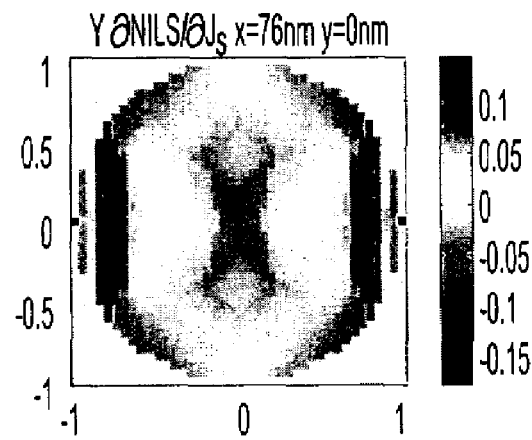
Figures 2, 9B:
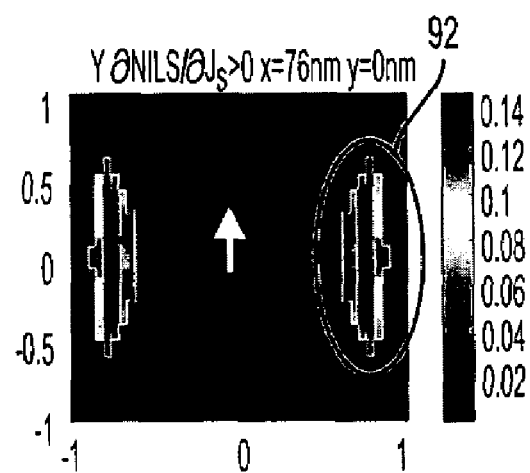
Figures 1, 10A:
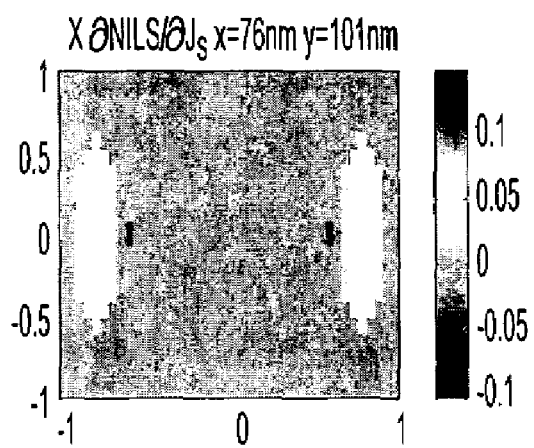
Figures 2, 10A:
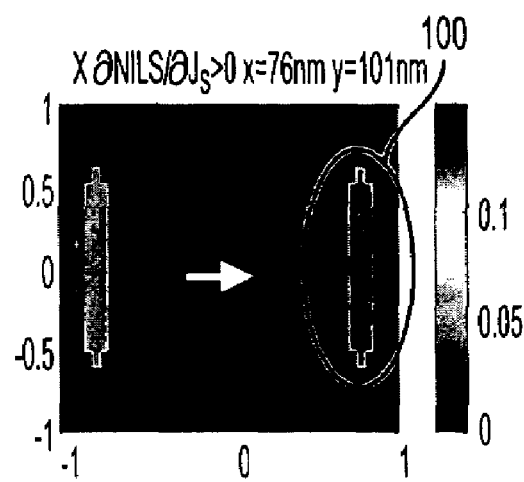
Figures 1, 10B:
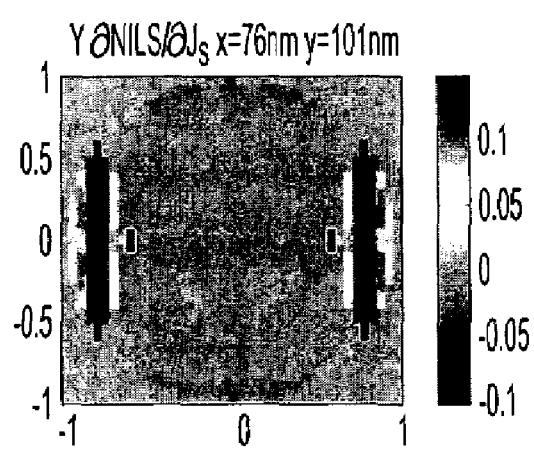
Figures 2, 10B:
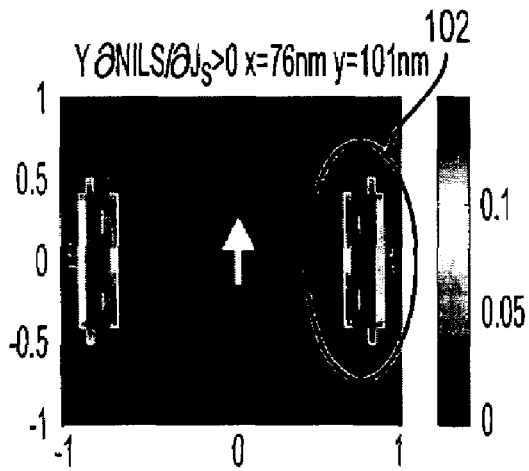
Figures 1, 11A:
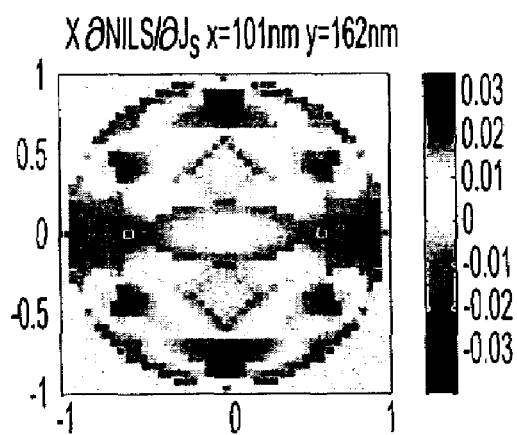
Figures 2, 11A:
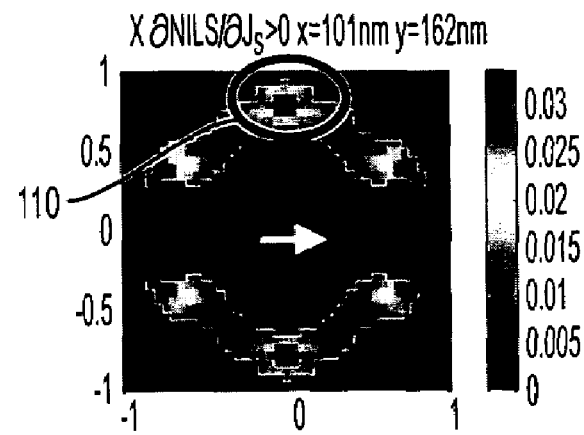
Figures 1, 11B:
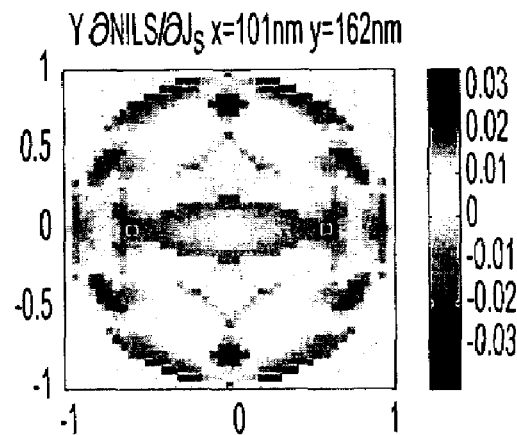
Figures 2, 11B:
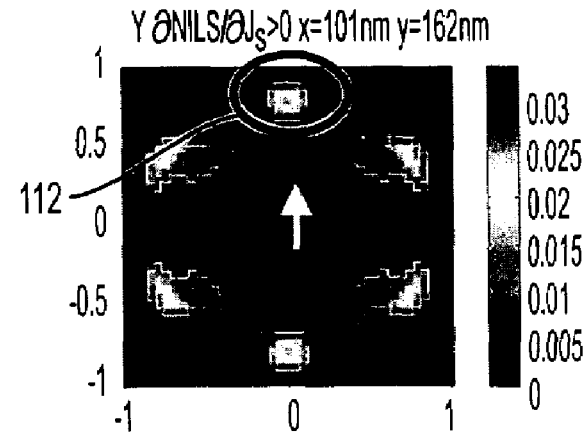
Figure 12A:
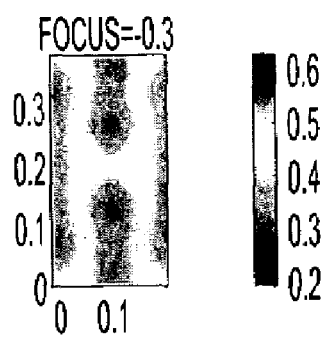
FIGS. 12(A)-(I) show a simulation of the print of the brick wall pattern of FIG. 4A with the wafer topography of FIG. 4B for optimized unpolarized illumination from a focus of −0.3 to a focus of 0.1 at increments of 0.05, respectively.
Figure 12B:
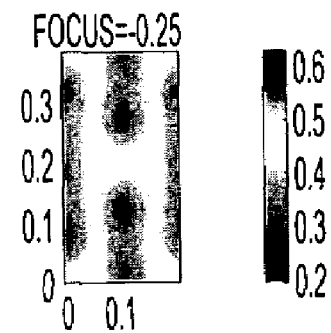
Figure 12C:
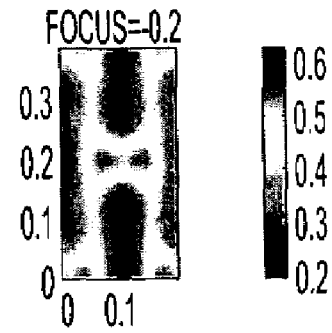
Figure 12D:
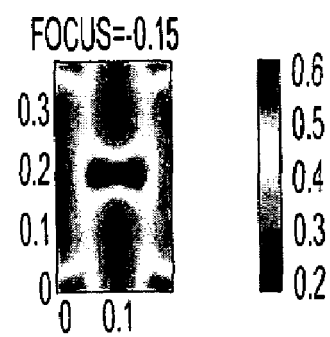
Figure 12E:
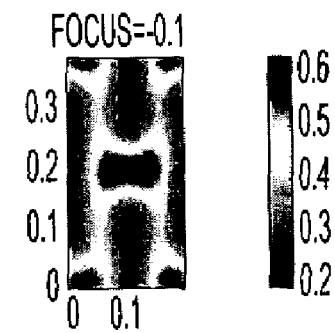
Figure 12F:
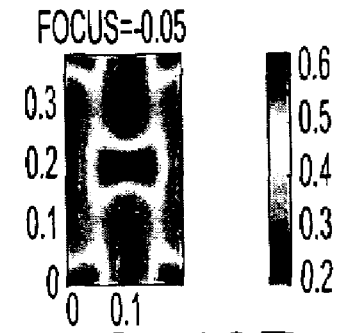
Figure 12G:
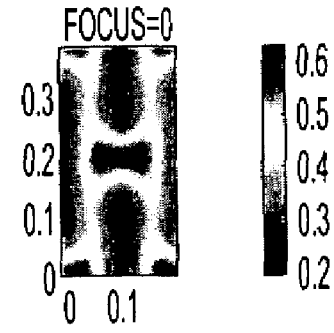
Figure 12H:
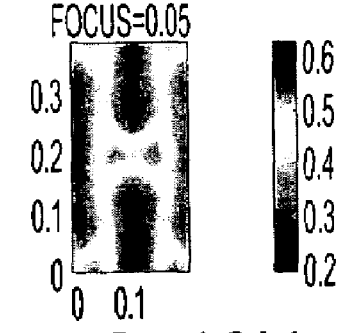
Figure 12I:
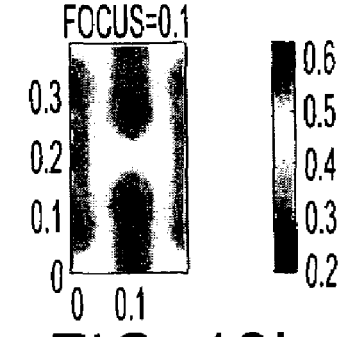
Figure 13A:
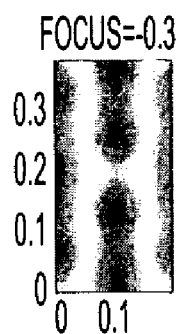
FIGS. 13(A)-(I) show a simulation of the print of the brick wall pattern of FIG. 4A with the wafer topography of FIG. 4B for optimized polarized illumination from a focus of −0.3 to a focus of 0.1 at increments of 0.05, respectively.
Figure 13B:
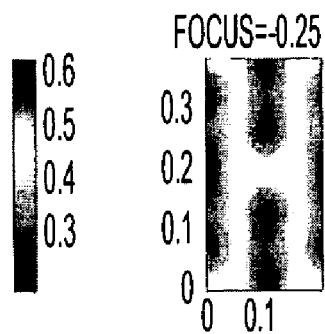
Figure 13C:
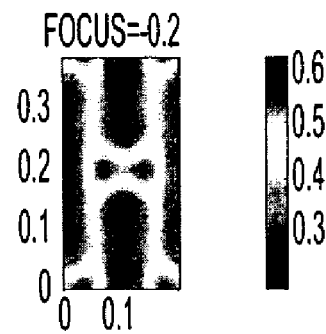
Figure 13D:
Figure 13E:
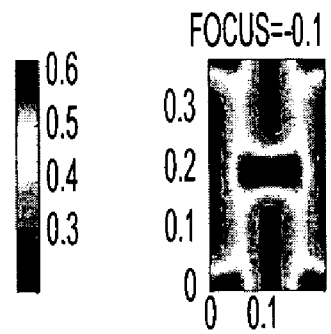
Figure 13F:
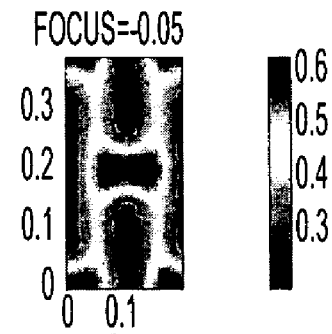
Figure 13G:
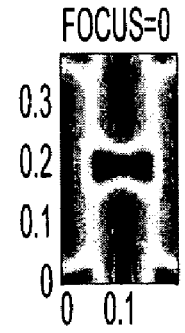
Figure 13H:
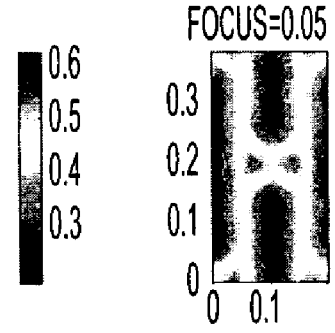
Figure 13I:
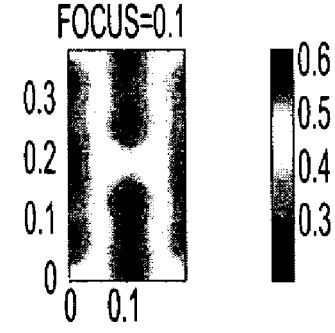

FIG. 6 illustrates the corresponding contour plot and illumination intensity for an optimized unpolarized state. By contrast, FIGS. 7 and 8 illustrate corresponding contour plots and illumination intensity for optimized polarized state and optimized TE polarized state, respectively. As can be seen by comparison of these contour plots, optimized polarization (FIG. 7) or optimized TE polarization (FIG. 8) provides greater illumination than that of optimized unpolarized illumination (FIG. 6). Specifically, greater illumination is represented by the expansiveness of the plot found along the poles in FIGS. 7 & 8 when compared against the plot for FIG. 6.

FIGS. 7 and 8 further illustrate the state of polarization defined by the plurality of polarization vectors 70 of FIG. 7 and the plurality of polarization vectors 80 of FIG. 8. As shown by the polarization vectors 70, 80, at certain corresponding points on the illuminator, only Y polarization is desirable and on other points only X polarization is desirable. Comparing FIG. 7 to FIG. 8, polarization vectors 70 change more abruptly than polarization vectors 80. This abrupt change is more desirable, as it improves image contrast.

FIGS. 9-11 illustrate illumination pupils NILS response plots at points 1, 2, and 3, respectively, on the brick wall pattern of FIG. 4A. Subfigures A-1 and A-2 of FIGS. 9-11 show NILS response plots at these points for X polarization, while subfigures B-1 and B-2 show NILS response plots at these points for Y polarization. For each fragmentation point, comparison of X and Y polarization shows that Y polarization has better illumination. For instance, comparison of subfigures A-1 and A-2 with subfigures B-1 and B-2 of FIG. 9, illumination intensity for Y polarization (FIGS. 9B-1 and B-2) show approximately a 300% improvement over X polarization. Specifically, intensity levels 90 are far less than intensity levels 92. Thus, for fragmentation point 1, use of Y polarization over X polarization dramatically improves illumination intensity.

As for fragmentation point 2, FIG. 10 illustrates corresponding pupil NILS response plots. Again, Y polarization has approximately a 300% improvement over X polarization shown by comparison intensity representation 100 and intensity representation 102. As for fragmentation point 3 (FIG. 11), by comparing intensity levels at 110 with those at 112, X polarization has a 40% improvement over Y polarization. Thus, at fragment point 3, it is preferable to use X polarization.

FIGS. 12-14 show simulation of the print of the brick wall pattern of FIG. 4A with wafer topography of FIG. 4B for optimized unpolarized illumination, optimized polarized illumination and optimized TE polarized illumination, respectively. Aerial images from a focus of −0.3 to a focus of 0.1 at increments of 0.05, respectively, are shown by subfigures A-I for FIGS. 12-14. Each subfigure shows an aerial image of the brick wall and the resist through focus. Comparison of respective focus figures, a focus of −0.1 (FIGS. 12E, 13E and 14E) tends to illustrate the brick wall having the best contrast. In turn, comparison of the brick wall image of each figure, FIGS. 13E and 14E show a slightly better contrast than that of FIG. 12E. Accordingly, optimized polarization (FIG. 13E) and optimized TE polarization (FIG. 14E) produce a higher contrast that than of optimized unpolarization illumination (FIG. 12E).

Figure 15A:
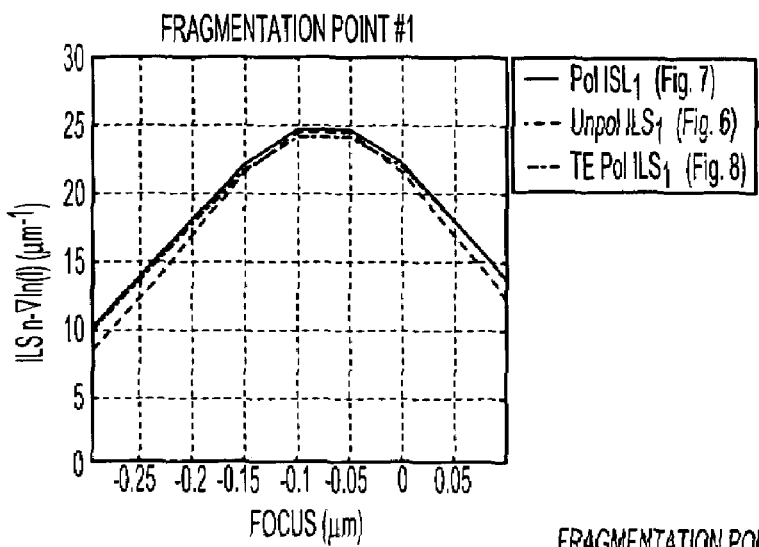
FIGS. 15A-C illustrate image log slope (ILS) plots at the three fragmentation points illustrated by FIG. 4A, respectively.
Figure 15B:
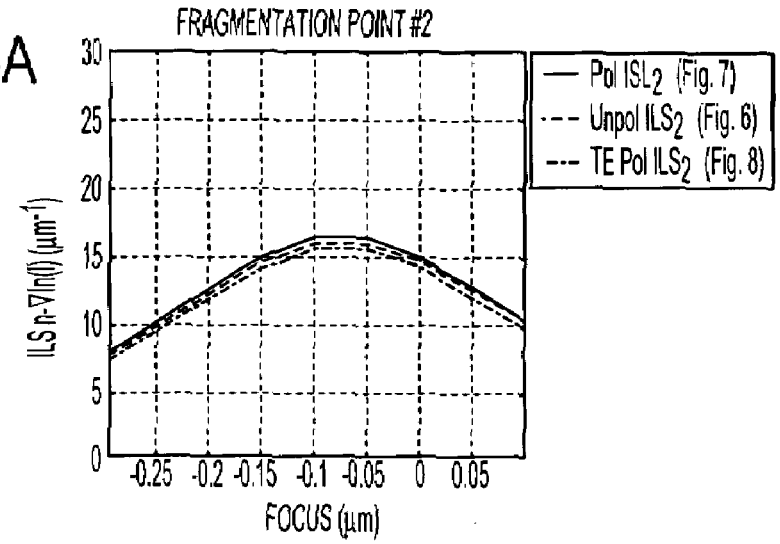
Figure 15C:
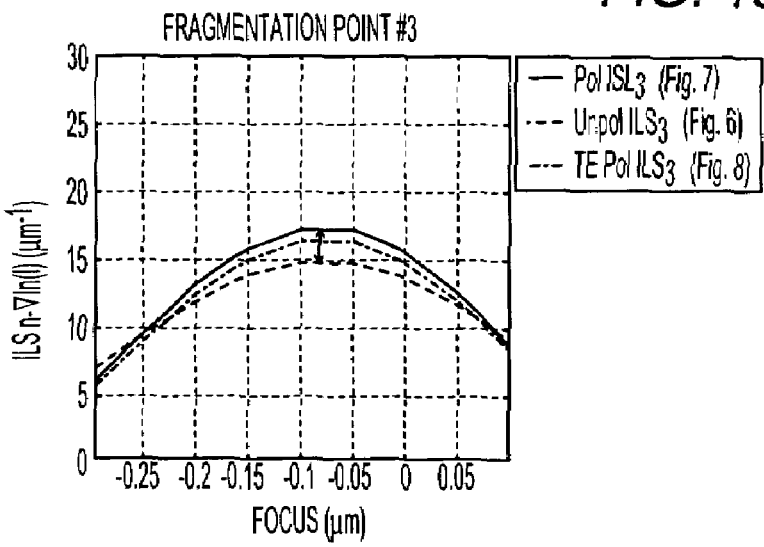

Alternatively, FIGS. 15A-15C illustrate ILS plots through focus for fragmentation points 1, 2 and 3 of the brick wall of FIG. 4A for unpolarized illumination, polarized illumination and TE polarized illumination, respectively. As discussed above, by minimizing the maximum ILS, polarization illumination may be optimized. Plots of FIGS. 15A-15C illustrate this unique feature. Specifically, at fragmentation point 1 (FIG. 15A), polarized illumination has the maximum ILS, while unpolarized illumination has the minimum ILS.

TE polarized illumination falls in between. The same is true for fragmentation point 2 (FIG. 15B) and for fragmentation point 3 (FIG. 15C). In other words, the lowest image log slope corresponds to the unpolarized case and the highest image log slope corresponds to the polarized case.

A higher image log slope results in a higher contrast, which in turn provides increased exposure latitude and a better process window. Therefore, by optimizing polarization at each fragmentation point as described above, determined in accordance with the flow diagram of FIG. 1, a higher process window may be obtained.

EXAMPLE 2

Dry System

Figure 16B:
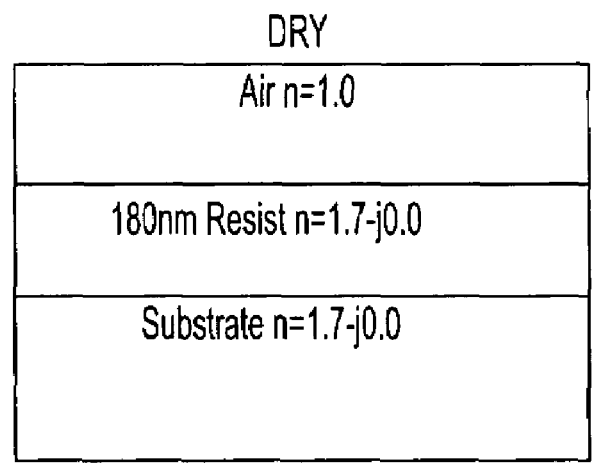
FIG. 16B illustrates wafer topography for a dry system.

As in FIG. 4A, FIG. 16A illustrates a half-pitch brick wall isolation pattern 160 for a 0.4 nm by 0.2 nm section of a microlithographic mask having three fragmentation points, denoted by numerals 1, 2 and 3. FIG. 16B however illustrates wafer topography for a dry system to which the brick wall pattern 160 of FIG. 16A will be applied. In a dry system, transmittance of air is 1. Again, an illumination system (described below) was used having a wavelength, λ, of 193 nm and a numerical aperture, NA, of 1.2.

Figures 1, 17A:
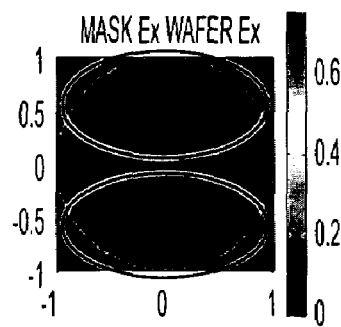
Figures 2, 17A:
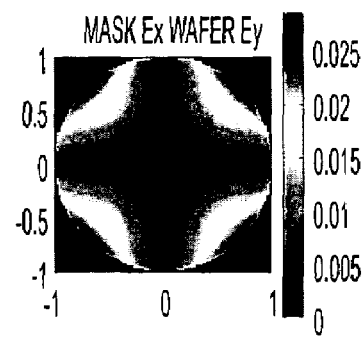
Figures 3, 17A:
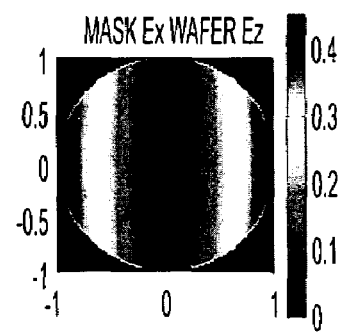
Figures 1, 17B:
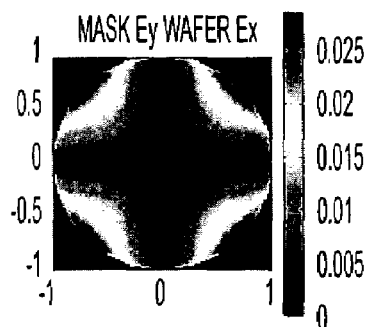
Figures 2, 17B:
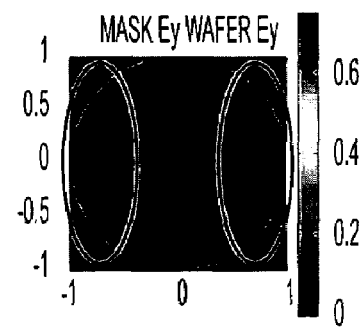
Figures 3, 17B:
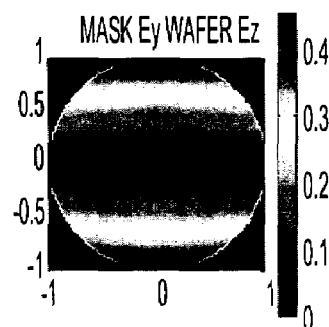

FIGS. 17A1-A3 and B1-B8 are the same as that illustrated by FIG. 5. Accordingly, projection pupils remain the same regardless of whether the wafer is immersed in water or dry. Description of this figure will not be repeated for the sake of conciseness.

Figure 18:
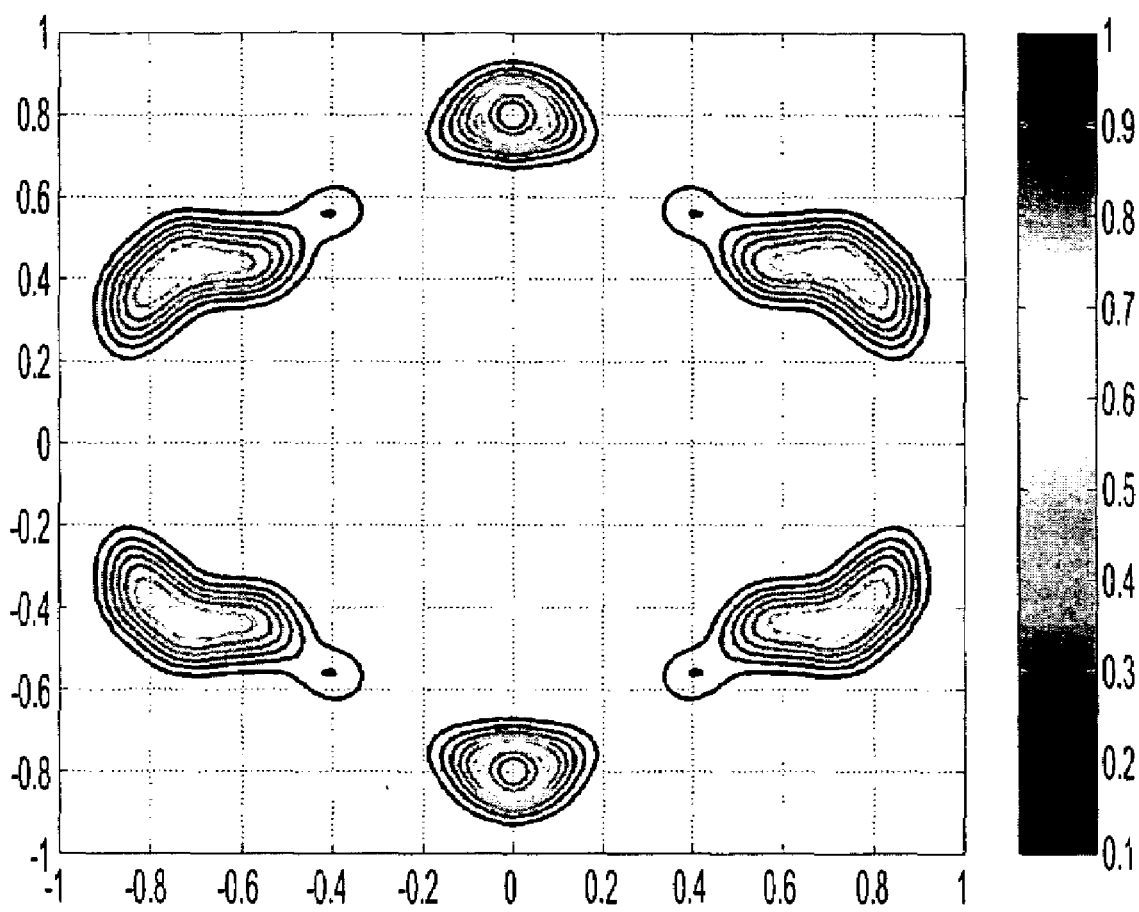
FIG. 18 illustrates an optimized unpolarized illumination for the brick wall pattern of FIG. 16A with the wafer topography of FIG. 16B.
Figure 19:
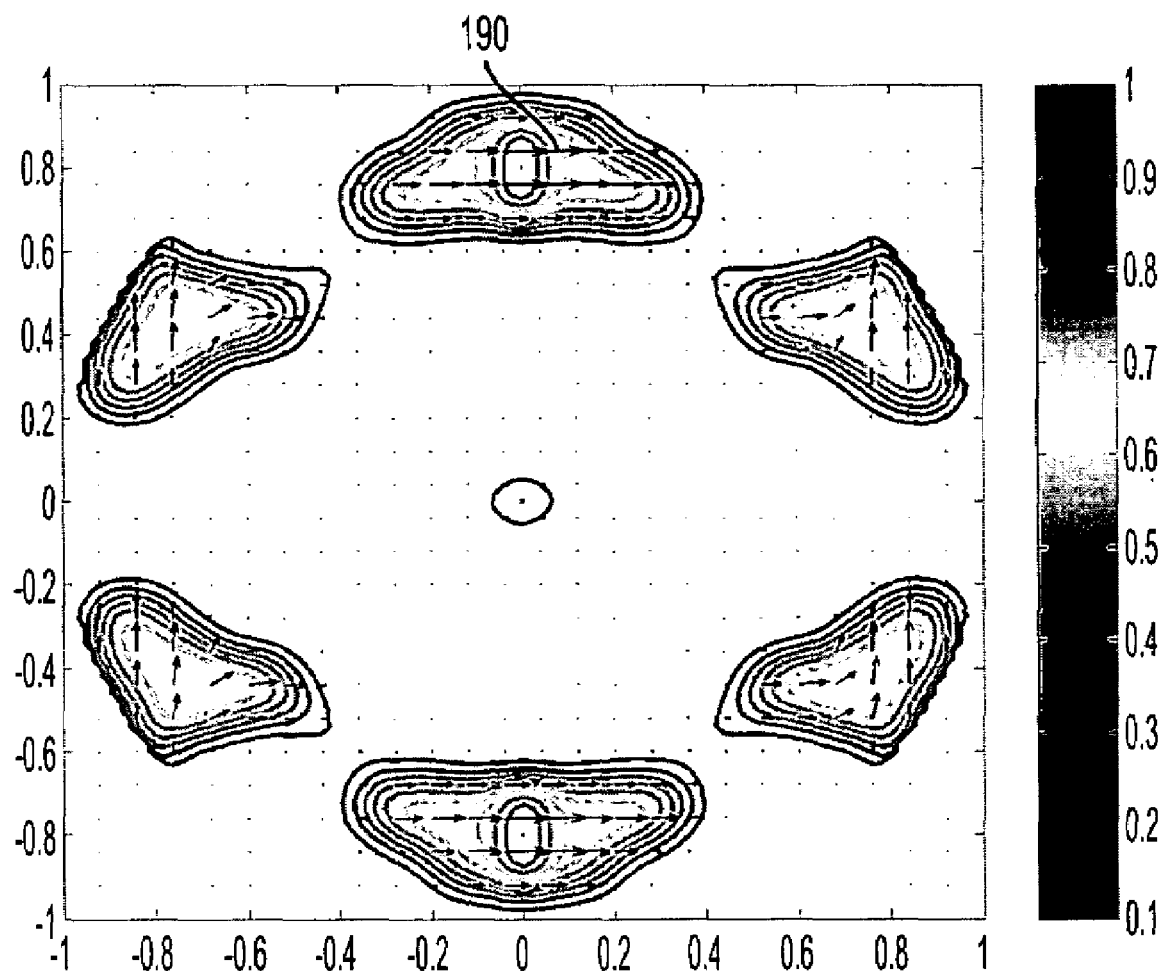
FIG. 19 illustrates an optimized polarized illumination for the brick wall pattern of FIG. 16A with the wafer topography of FIG. 16B.
Figure 20:
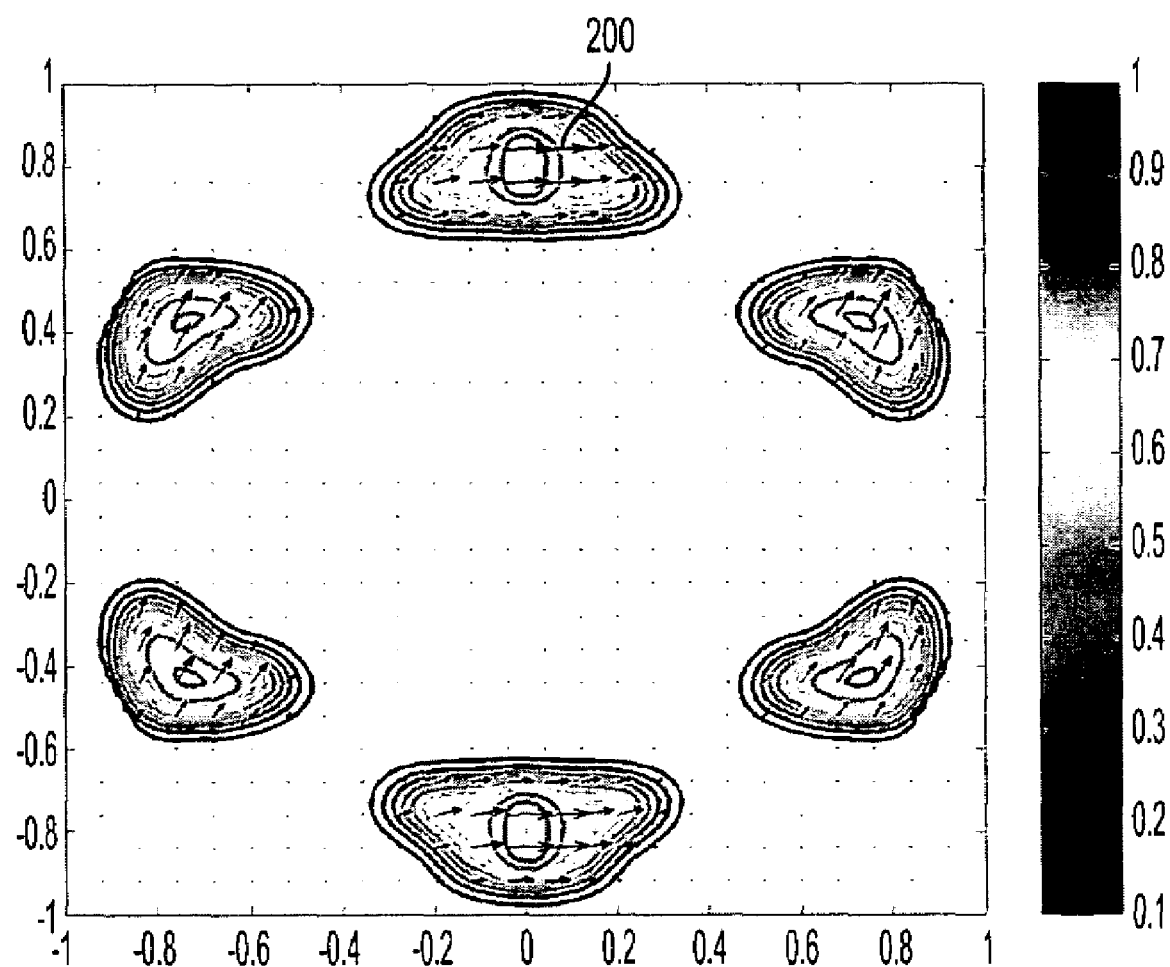
FIG. 20 illustrates optimized TE azimuthal polarized illumination for the brick wall pattern of FIG. 16A with the wafer topography of FIG. 16B.
Figures 1, 21A:
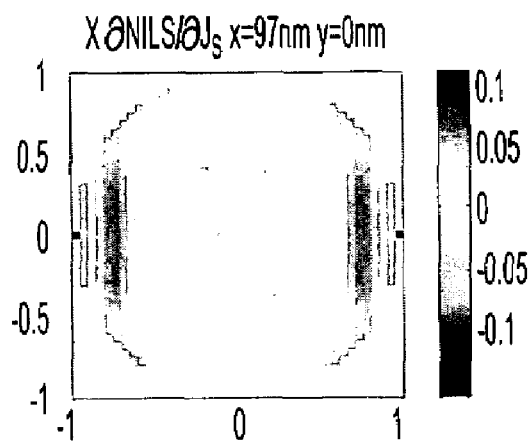
Figures 2, 21A:
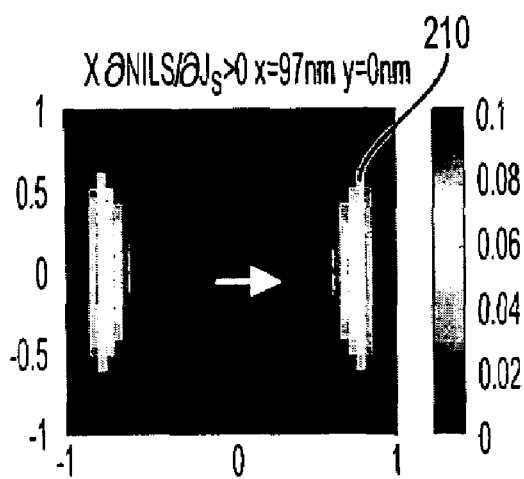
Figures 1, 21B:
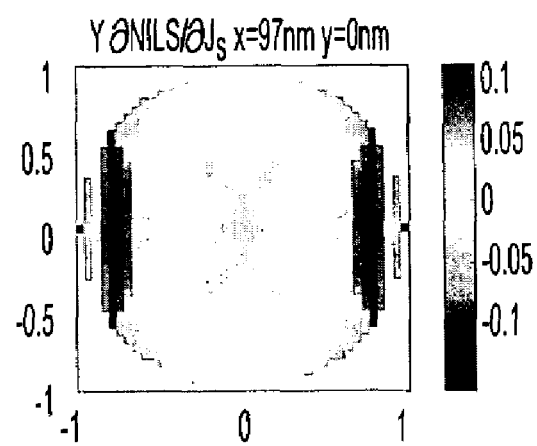
Figures 2, 21B:
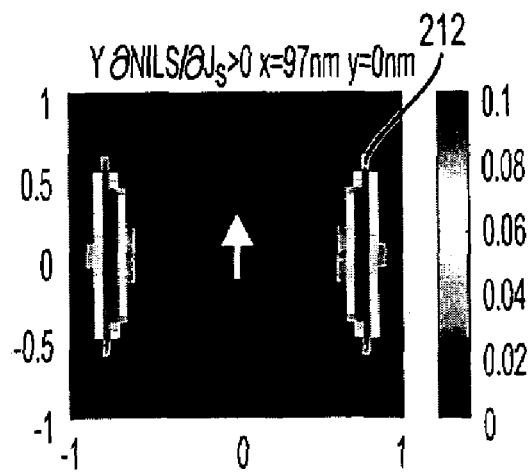
Figures 1, 22A:
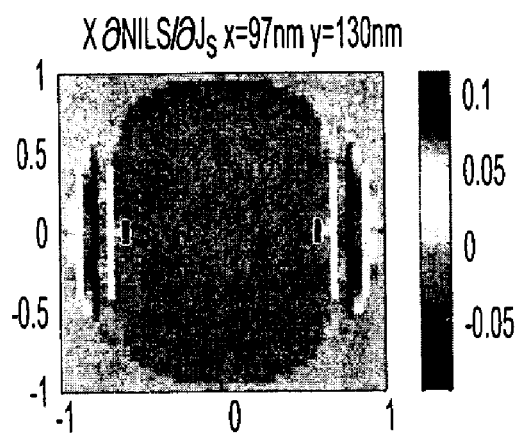
Figures 2, 22A:
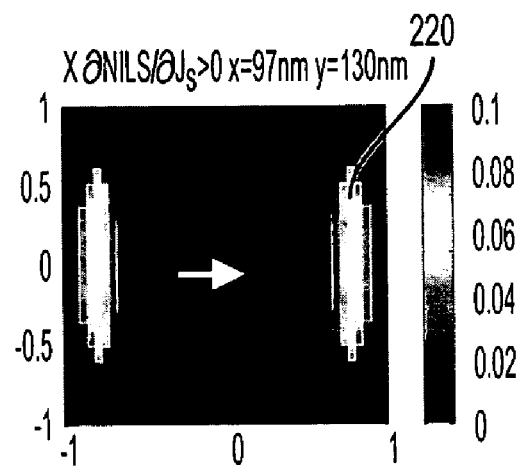
Figures 1, 22B:
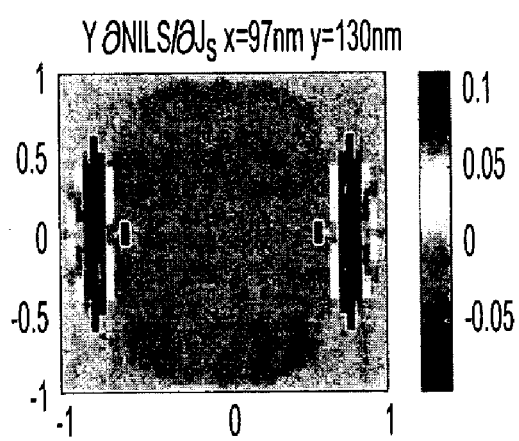
Figures 2, 22B:
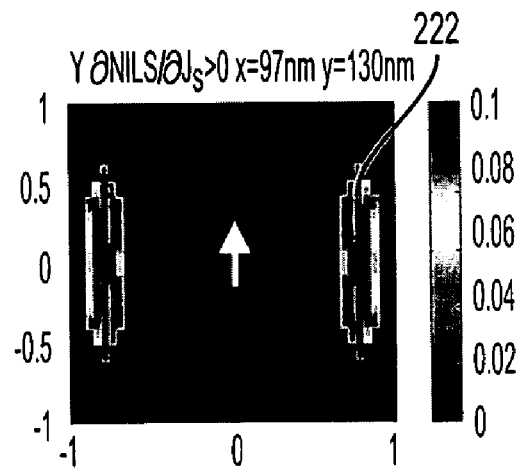
Figures 1, 23A:
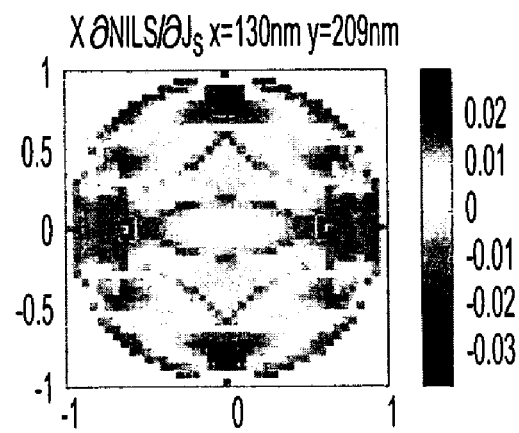
Figures 2, 23A:
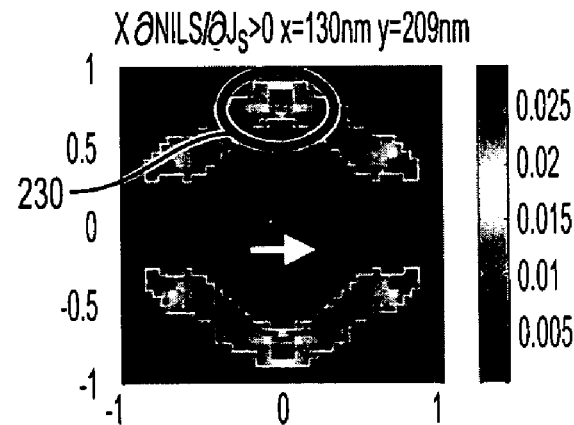
Figures 1, 23B:
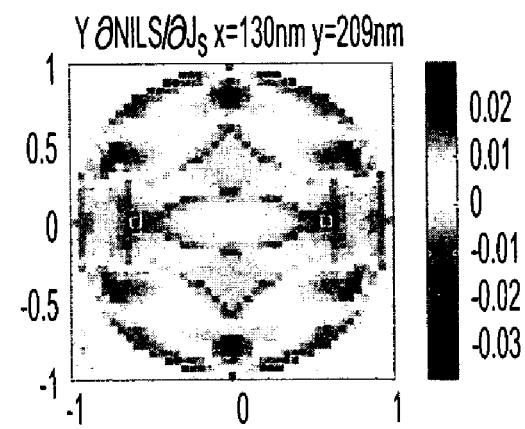
Figures 2, 23B:
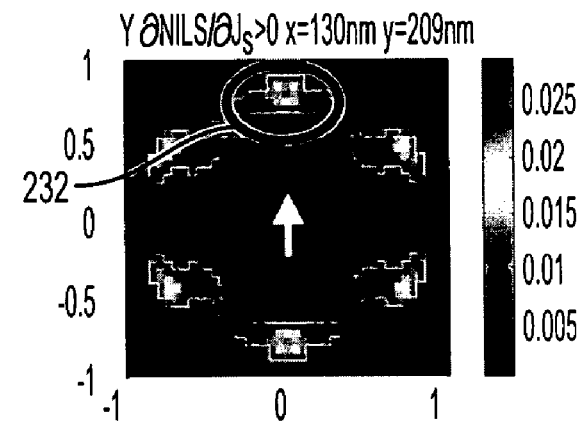
Figure 24A:
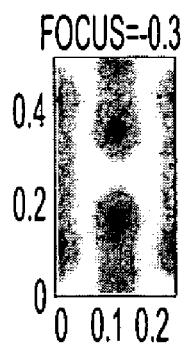
FIGS. 24(A)-(I) show a simulation of the print of the brick wall pattern of FIG. 16A with the wafer topography of FIG. 16B for optimized unpolarized illumination from a focus of −0.3 to a focus of 0.1 at increments of 0.05, respectively.
Figure 24B:
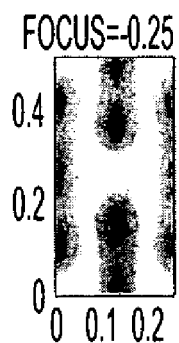
Figure 24C:
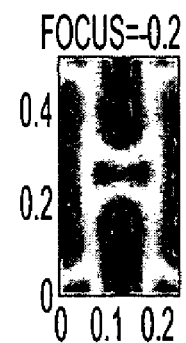
Figure 24D:
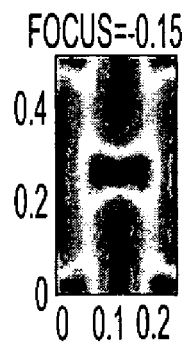
Figure 24E:
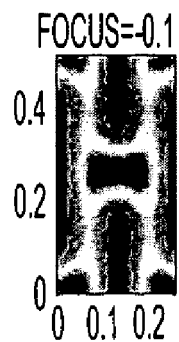
Figure 24F:
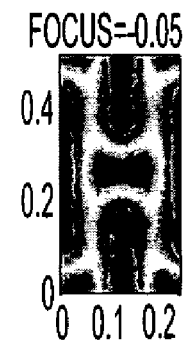
Figure 24G:
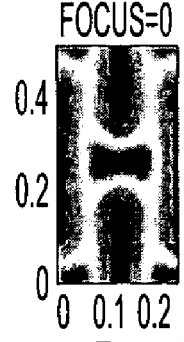
Figure 24H:
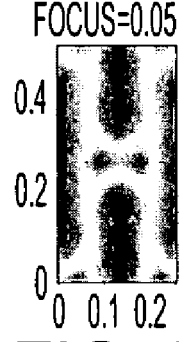
Figure 24I:
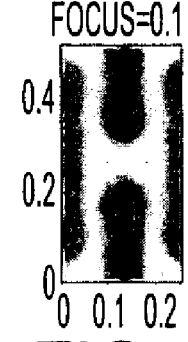
Figure 25A:
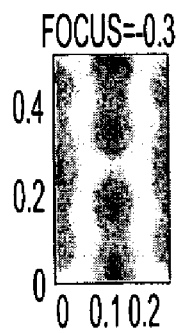
FIGS. 25(A)-(I) show a simulation of the print of the brick wall pattern of FIG. 16A with the wafer topography of FIG. 16B for optimized polarized illumination from a focus of −0.3 to a focus of 0.1 at increments of 0.05, respectively.
Figure 25B:
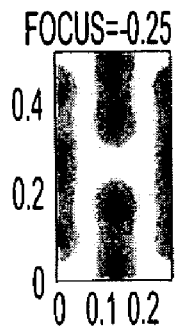
Figure 25C:
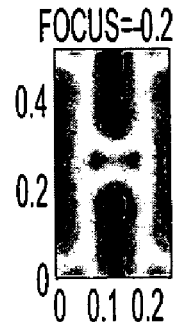
Figure 25D:
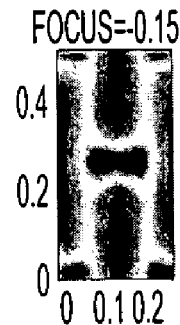
Figure 25E:
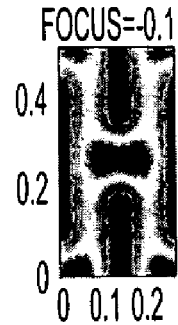
Figure 25F:
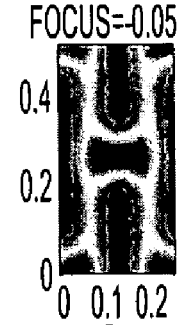
Figure 25G:
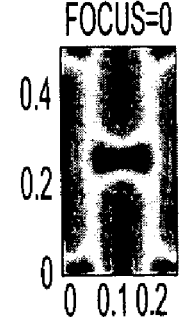
Figure 25H:
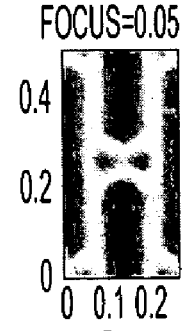
Figure 25I:
Figure 26A:
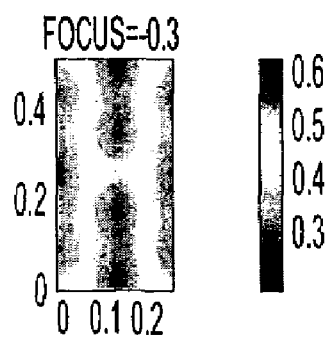
FIGS. 26(A)-(I) show a simulation of the print of the brick wall pattern of FIG. 16A with the wafer topography of FIG. 16B for optimized TE polarized illumination from a focus of −0.3 to a focus of 0.1 at increments of 0.05, respectively.
Figure 26B:
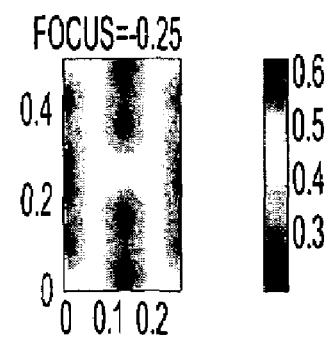
Figure 26C:
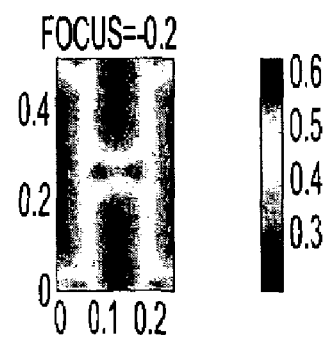
Figure 26D:
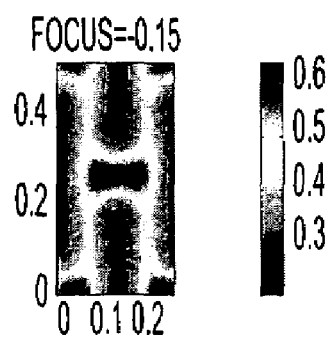
Figure 26E:
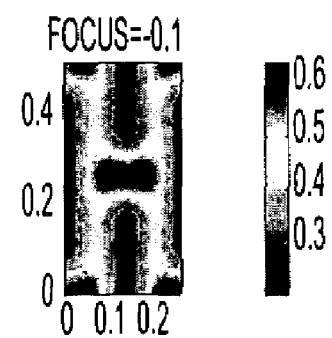
Figure 26F:
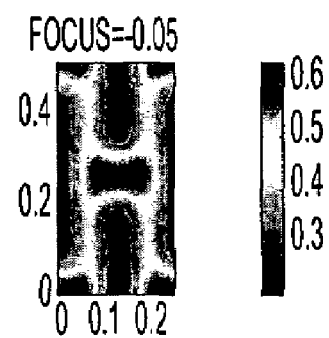
Figure 26G:
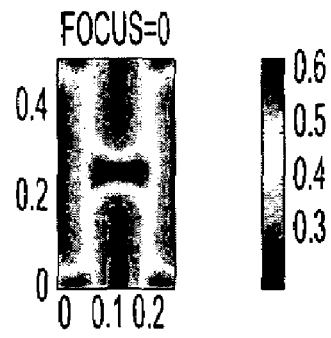
Figure 26H:
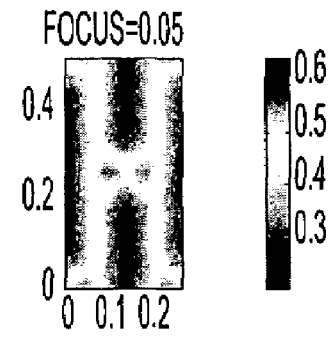
Figure 26I:
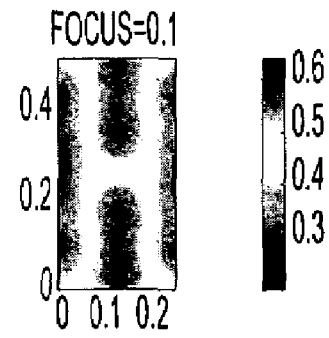

FIG. 18 illustrates the corresponding contour plot and illumination intensity for an optimized unpolarized state. By contrast, FIGS. 19 and 20 illustrate corresponding contour plots and illumination intensity for optimized polarized state and optimized TE polarized state, respectively. As in the case of an immersed system, optimized polarization (FIG. 19) or optimized TE polarization (FIG. 20) provides better illumination than that of optimized unpolarized illumination (FIG. 18). FIGS. 19 and 20 illustrate further states of polarization defined by the plurality of polarization vectors 190 of FIG. 19 and the plurality of polarization vectors 200 of FIG. 20. As shown by the polarization vectors 190, 200, at certain points on the illuminator, only Y polarization is desirable, and on other points, only X polarization is desirable. As before, polarization vectors 190 change more abruptly than do polarization vectors 200, and are therefore more desirable and give a better contrast.

FIGS. 21-23 illustrate illumination pupils NILS response plots at points 1, 2, and 3, respectively, on the brick wall pattern of FIG. 16A. Subfigures A-1 and A-2 of FIGS. 21-23 show NILS response plots at these points for X polarization, while subfigures B-1 and B-2 show NILS response plots at these points for Y polarization. For each fragmentation point, comparison of X and Y polarization shows greater illumination for X polarization. Comparison of subfigures A-1 and A-2 with subfigures B-1 and B-2 for FIG. 21, illumination intensity for Y polarization (FIGS. 21B-1 and B-2) show approximately a 50% improvement over X polarization. Specifically, comparison of intensity levels 212 show a 50% improvement over the intensity levels 210. Thus, for fragmentation point 1, use of Y polarization over X polarization improves illumination intensity.

As for fragmentation point 2, FIG. 22 illustrates corresponding pupil NILS response plots. Again, Y polarization has a 50% improvement over X polarization shown by comparison intensity levels 220 and intensity levels 222. As for fragmentation point 3 (FIG. 11), X polarization has a 40% improvement over Y polarization. Thus, at fragment point 3, it is preferable to use X polarization.

FIGS. 24-26 show simulation of the print of the brick wall pattern of FIG. 16A with the wafer topography of FIG. 16B for optimized unpolarized illumination, optimized polarized illumination and optimized TE polarized illumination, respectively. Aerial images from a focus of –0.3 to a focus of 0.1 at increments of 0.05, respectively, are shown by subfigures A-I of each of FIGS. 24-26. Each subfigure shows an aerial image of the brick wall and the resist through focus. Comparison of respective focus figures, a focus of –0.1 (FIGS. 24E, 25E and 26E) tends to illustrate the brick wall at the highest contrast. In turn, comparison of the brick wall image of each figure, FIGS. 25E and 26E show a slightly better contrast than that of FIG. 24E. Accordingly, optimized polarization (FIG. 25E) and optimized TE polarization (FIG. 26E) produce an image a higher contrast that than of optimized unpolarized illumination (FIG. 24E).

Figure 27A:
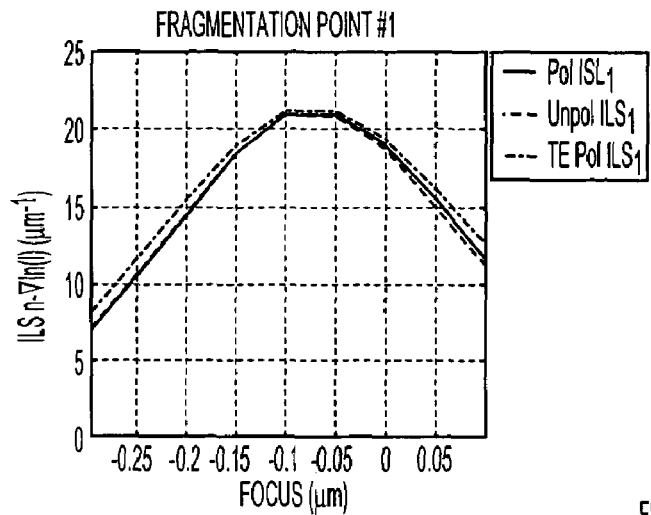
FIGS. 27A-C illustrate image log slope (ILS) plots at the three fragmentation points illustrated by FIG. 16A, respectively.
Figure 27B:
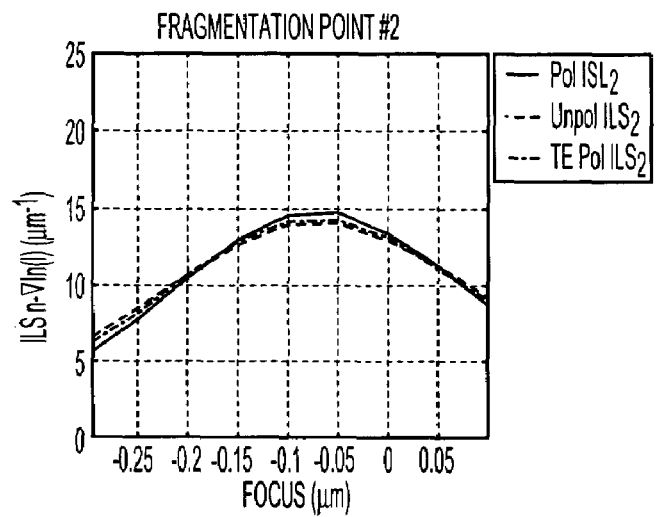
Figure 27C:
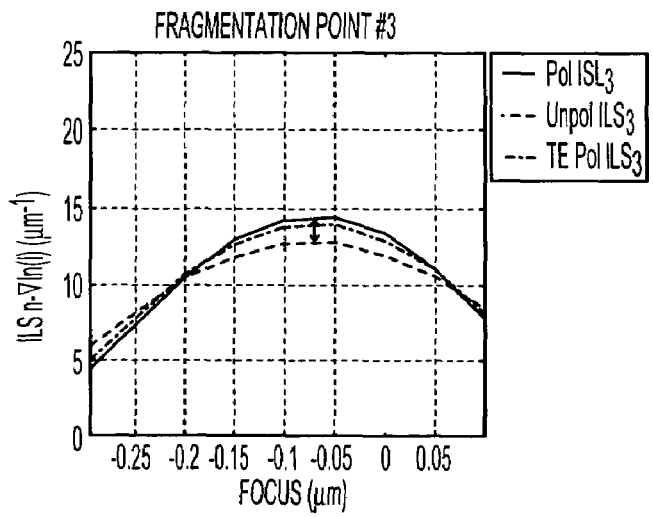

Alternatively, FIGS. 27A-C illustrate ILS plots through focus for fragmentation points 1, 2 and 3 of the brick wall of FIG. 16A for unpolarized illumination, polarized illumination and TE polarized illumination, respectively. As discussed above, by minimizing the maximum NILS, polarization illumination may be optimized. At fragmentation point 1 (FIG. 27A), TE azimuthal illumination has the maximum ILS, while unpolarized illumination has the minimum ILS. The same is true for fragmentation point 2 (FIG. 27B). However, as regards fragmentation point 3 (FIG. 27C), optimized polarization improves ILS by approximately 15% over unpolarized illumination.

In conclusion, a higher image log slope results in a higher contrast, which in turn gets more exposure latitude and a better process window. Therefore, by optimizing polarization at each fragmentation point as described above and determined in accordance with the flow diagram of FIG. 2, a higher process window may be obtained.

Figure 28:
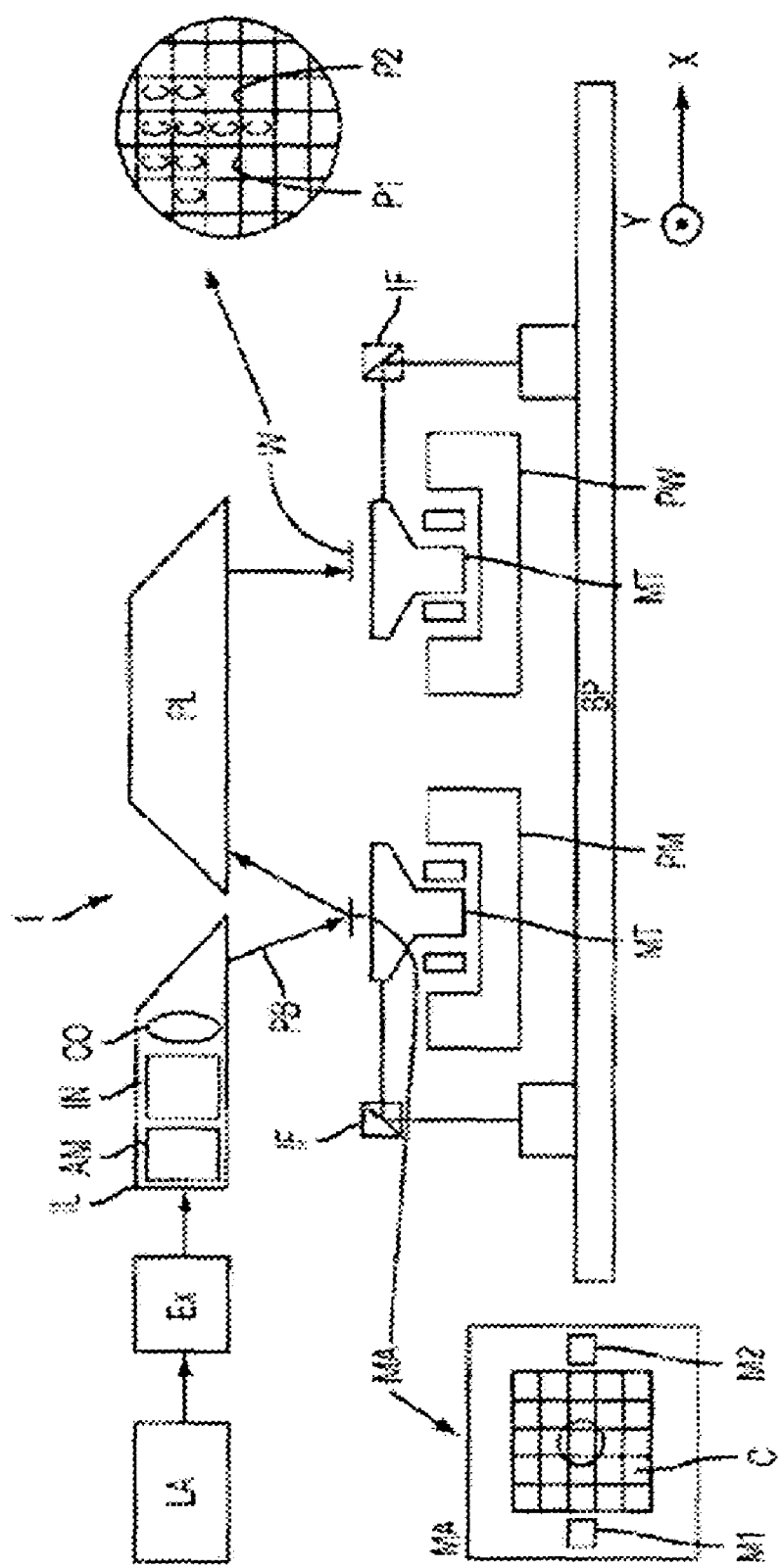
FIG. 28 schematically depicts a lithographic projection apparatus suitable for use with a mask designed with the aid of the concepts discussed herein.

FIG. 28 schematically depicts a lithographic projection apparatus suitable for use with a mask designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 28 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 28. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Software functionalities of a computer system involve programming, including executable code, may be used to implement the above described imaging model. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of optimizing polarization of an illumination of a pattern to be formed in a surface of a substrate, comprising the steps of:
   (a) determining an illumination intensity for at least one point on an illuminator for at least two polarization states;
   (b) determining an image log slope (ILS) for the at least one point on the illuminator for the at least two polarization states;
   (c) determining a maximum point where the ILS is at least near zero for the at least one point on the illuminator; and
   (d) selecting an optimal polarization state for the maximum ILS for the at least one point on the illuminator for optimizing a resolution of the pattern to be formed in the surface of the substrate.

2. The method of optimizing polarization of the illumination according to claim 1, further comprising repeating steps (a)-(d) for each of a plurality of points on the illuminator.

3. The method of optimizing polarization of the illumination according to claim 1, further comprising repeating steps (a)-(d) for each of a plurality of points on part of the illuminator relative to symmetry of a feature.

4. The method of optimizing polarization of the illuminator according to claim 1, further comprising repeating steps (a)-(d) for each of a plurality of points on half of the illuminator.

5. The method of optimizing polarization of an illuminator according to claim 2, further comprising the step of combining the optimal polarization state for each of the plurality of points on the illuminator for creating an optimal illumination of the pattern.

6. The method of optimizing polarization of an illuminator according to claim 1, wherein the optimal polarization state is a variant of the at least two polarization states.

7. The method of optimizing polarization of an illuminator according to claim 1, wherein the optimal polarization state corresponds to one of the at least two polarization states.

8. The method of optimizing polarization of an illuminator according to claim 1, wherein the at least two polarization states includes at least X and Y polarization states.

9. A computer program product, comprising executable code stored on and transportable by at least one computer readable medium, wherein execution of the code by at least one programmable computer causes the at least one programmable computer to perform a sequence of steps for optimizing polarized illumination for a pattern to be formed in a surface of a substrate, comprising:
   (a) calculating an illumination intensity for at least one point on an illuminator for at least two polarization states;
   (b) calculating an image log slope (ILS) for the at least one point on the illuminator for the at least two polarization states;
   (c) determining a maximum point the ILS is at least near zero for the at least one point on the illuminator; and
   (d) selecting an optimal polarization state for the maximum ILS for the at least one point on the illuminator for optimizing a resolution of the pattern to be formed in the surface of the substrate.

10. The computer program product according to claim 9, further comprising the steps of repeating steps (a)-(d) for each of a plurality of points on the illuminator.

11. The computer program product according to claim 9 further comprising repeating steps (a)-(d) for each of a plurality of points on part of an illuminator relative to symmetry of a feature.

12. The computer program product according to claim 9 further comprising repeating steps (a)-(d) for each of a plurality of points on half of the illuminator.

13. The computer program product according to claim 10, further comprising the step of combining the optimal polarization state for each of the plurality of points on the illuminator for creating an optimal illumination of the pattern.

14. The computer program product according to claim 9, wherein the optimal polarization state is a variant of the at least two polarization states.

15. The computer program product according to claim 9, wherein the optimal polarization state corresponds to one of the at least two polarization states.

16. The computer program product according to claim 9, wherein the at least two polarization states includes at least X and Y polarization states.

* * * * *